United States Patent
Derner et al.

(10) Patent No.: US 10,867,675 B2
(45) Date of Patent: Dec. 15, 2020

(54) APPARATUSES AND METHODS FOR MEMORY INCLUDING FERROELECTRIC MEMORY CELLS AND DIELECTRIC MEMORY CELLS

(71) Applicant: Micron Technology, Inc., Boise, ID (US)

(72) Inventors: Scott J. Derner, Boise, ID (US); Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/005,493

(22) Filed: Jun. 11, 2018

(65) Prior Publication Data
US 2019/0019553 A1    Jan. 17, 2019

Related U.S. Application Data

(60) Provisional application No. 62/532,205, filed on Jul. 13, 2017.

(51) Int. Cl.
  *G11C 14/00*    (2006.01)
  *G11C 11/22*    (2006.01)
  (Continued)

(52) U.S. Cl.
  CPC ........ *G11C 14/0027* (2013.01); *G11C 11/005* (2013.01); *G11C 11/221* (2013.01);
  (Continued)

(58) Field of Classification Search
  CPC . G11C 11/005; G11C 11/221; G11C 11/2273; G11C 11/2275; G11C 11/4091;
  (Continued)

(56) References Cited

U.S. PATENT DOCUMENTS

| 4,103,342 A | 7/1978 | Miersch et al. |
| 4,853,893 A * | 8/1989 | Eaton, Jr. ................ G11C 11/22 365/145 |

(Continued)

FOREIGN PATENT DOCUMENTS

| CN | 1519940 A | 8/2004 |
| CN | 1812105 A | 8/2006 |

(Continued)

OTHER PUBLICATIONS

International Search Report and Written Opinion dated Nov. 5, 2018 for PCT Application No. PCT/US2018/041513, 11 pages.

(Continued)

*Primary Examiner* — Sung Il Cho
(74) *Attorney, Agent, or Firm* — Dorsey & Whitney LLP

(57) ABSTRACT

Apparatuses and methods for memory including ferroelectric memory cells and dielectric memory cells are disclosed. The apparatus includes a first memory cell including first and second ferroelectric capacitors configured to store charges representing complementary logical values, a second memory cell including first and second dielectric capacitors configured to store charges representing complementary logical values, a first bit line selectably coupled to the first ferroelectric capacitor of the first memory cell and to the first dielectric capacitor of the second memory cell, a second bit line selectably coupled to the second ferroelectric capacitor of the first memory cell and to the second dielectric capacitor of the second memory cell, and a sense amplifier coupled to the first and second bit lines.

30 Claims, 21 Drawing Sheets

(51) Int. Cl.
  *G11C 11/4091* (2006.01)
  *H01L 27/11507* (2017.01)
  *G11C 11/4097* (2006.01)
  *H01L 49/02* (2006.01)
  *G11C 11/4096* (2006.01)
  *H01L 27/108* (2006.01)
  *G11C 11/00* (2006.01)
  *H01L 27/11509* (2017.01)
  *H01L 27/105* (2006.01)

(52) U.S. Cl.
  CPC ...... *G11C 11/2273* (2013.01); *G11C 11/2275* (2013.01); *G11C 11/4091* (2013.01); *G11C 11/4096* (2013.01); *G11C 11/4097* (2013.01); *H01L 27/105* (2013.01); *H01L 27/108* (2013.01); *H01L 27/10805* (2013.01); *H01L 27/10894* (2013.01); *H01L 27/11507* (2013.01); *H01L 27/11509* (2013.01); *H01L 28/40* (2013.01); *H01L 28/55* (2013.01)

(58) Field of Classification Search
  CPC ............ G11C 11/4096; G11C 11/4097; G11C 14/0027; H01L 27/105; H01L 27/108; H01L 27/10805; H01L 27/10894; H01L 27/11507; H01L 27/11509; H01L 28/40; H01L 28/55
  USPC ........................................................ 365/145
  See application file for complete search history.

(56) References Cited

U.S. PATENT DOCUMENTS

| | | | |
|---|---|---|---|
| 4,888,733 A | 12/1989 | Mobley et al. | |
| 5,218,566 A | 6/1993 | Papaliolios | |
| 5,241,503 A | 8/1993 | Cheng | |
| 5,307,304 A * | 4/1994 | Saito | G11C 11/22 365/145 |
| 5,309,391 A | 5/1994 | Papaliolios | |
| 5,350,705 A | 9/1994 | Brassington et al. | |
| 5,373,463 A | 12/1994 | Jones, Jr. et al. | |
| 5,381,364 A | 1/1995 | Chern et al. | |
| 5,392,234 A | 2/1995 | Hirano et al. | |
| 5,400,275 A | 3/1995 | Abe et al. | |
| 5,539,279 A * | 7/1996 | Takeuchi | G11C 11/22 365/145 |
| 5,541,872 A | 7/1996 | Lowrey et al. | |
| 5,598,366 A | 1/1997 | Kraus et al. | |
| 5,617,349 A * | 4/1997 | Koike | G11C 11/22 365/145 |
| 5,675,530 A | 10/1997 | Hirano et al. | |
| 5,798,964 A | 8/1998 | Shimizu et al. | |
| 5,889,695 A | 3/1999 | Kawagoe | |
| 5,889,696 A | 3/1999 | Kawakubo et al. | |
| 5,912,846 A | 6/1999 | Taylor | |
| 5,917,746 A | 6/1999 | Seyyedy | |
| 5,959,922 A | 9/1999 | Jung | |
| 6,028,783 A | 2/2000 | Allen et al. | |
| 6,034,884 A | 3/2000 | Jung | |
| 6,038,160 A | 3/2000 | Nakane et al. | |
| 6,072,711 A | 6/2000 | Kang | |
| 6,147,895 A | 11/2000 | Kamp | |
| 6,154,387 A | 11/2000 | Takata | |
| 6,198,654 B1 | 3/2001 | Ashikaga | |
| 6,229,730 B1 | 5/2001 | Kato | |
| 6,363,002 B1 * | 3/2002 | Nishimura | G11C 11/22 365/145 |
| 6,483,737 B2 | 11/2002 | Takeuchi et al. | |
| 6,538,914 B1 | 3/2003 | Chung | |
| 6,687,151 B2 | 2/2004 | Endo et al. | |
| 6,807,082 B2 | 10/2004 | Aoki et al. | |
| 6,961,271 B2 * | 11/2005 | Jeon | G11C 11/404 365/190 |
| 7,154,767 B2 | 12/2006 | Sakuma | |
| 9,514,797 B1 * | 12/2016 | Chu | G11C 11/221 |
| 10,074,414 B2 | 9/2018 | Derner et al. | |
| 10,127,965 B2 | 11/2018 | Kawamura et al. | |
| 10,127,972 B2 | 11/2018 | Kawamura et al. | |
| 10,153,018 B2 | 12/2018 | Derner et al. | |
| 10,354,712 B2 | 7/2019 | Derner et al. | |
| 10,418,083 B2 | 9/2019 | Derner et al. | |
| 10,431,283 B2 | 10/2019 | Kawamura et al. | |
| 2001/0053087 A1 | 12/2001 | Kato et al. | |
| 2002/0043676 A1 * | 4/2002 | Ohtsuka | G11C 11/22 257/295 |
| 2002/0044477 A1 * | 4/2002 | Takeuchi | G11C 11/22 365/145 |
| 2002/0176274 A1 | 11/2002 | Ashikaga | |
| 2003/0117832 A1 | 6/2003 | Tomishima | |
| 2003/0173604 A1 | 9/2003 | Aoki et al. | |
| 2003/0185040 A1 | 10/2003 | Rickes et al. | |
| 2003/0206430 A1 | 11/2003 | Ho | |
| 2004/0090813 A1 | 5/2004 | Park | |
| 2004/0095799 A1 * | 5/2004 | Jacob | G11C 29/50 365/149 |
| 2004/0119105 A1 | 6/2004 | Wilson | |
| 2005/0012125 A1 | 1/2005 | Summerfelt et al. | |
| 2005/0012130 A1 | 1/2005 | Forbes | |
| 2005/0032301 A1 | 2/2005 | Udayakumar et al. | |
| 2005/0122763 A1 | 6/2005 | Yamamura | |
| 2005/0128784 A1 | 6/2005 | Kawashima et al. | |
| 2005/0146918 A1 | 7/2005 | Ogiwara et al. | |
| 2006/0083049 A1 | 4/2006 | Chandler et al. | |
| 2006/0215472 A1 | 9/2006 | Yoon et al. | |
| 2006/0221746 A1 | 10/2006 | Kang et al. | |
| 2006/0285378 A1 | 12/2006 | Yamaoka et al. | |
| 2007/0058414 A1 * | 3/2007 | Hoya | G06F 11/1044 365/145 |
| 2007/0133258 A1 | 6/2007 | Kim | |
| 2008/0265300 A1 | 10/2008 | Akiyama et al. | |
| 2009/0010037 A1 | 1/2009 | Kang et al. | |
| 2009/0231902 A1 | 9/2009 | Takashima | |
| 2009/0273963 A1 | 11/2009 | Nagai | |
| 2010/0052023 A1 | 3/2010 | Kanaya | |
| 2010/0165704 A1 | 7/2010 | Wu et al. | |
| 2010/0321975 A1 * | 12/2010 | Kimura | G11C 11/4094 365/145 |
| 2011/0128769 A1 | 6/2011 | Kimura | |
| 2011/0199811 A1 | 8/2011 | Kanno et al. | |
| 2012/0074466 A1 | 3/2012 | Setiadi et al. | |
| 2012/0127776 A1 | 5/2012 | Kawashima | |
| 2012/0170348 A1 | 7/2012 | Clinton et al. | |
| 2012/0170349 A1 | 7/2012 | Clinton et al. | |
| 2012/0307545 A1 | 12/2012 | McAdams et al. | |
| 2013/0094274 A1 | 4/2013 | Kaneko | |
| 2013/0229849 A1 | 9/2013 | Kawashima | |
| 2014/0036567 A1 | 2/2014 | Fukuzumi et al. | |
| 2015/0355886 A1 * | 12/2015 | Peeters | G11C 7/20 708/250 |
| 2018/0061468 A1 | 3/2018 | Derner et al. | |
| 2018/0061469 A1 | 3/2018 | Derner et al. | |
| 2018/0061471 A1 | 3/2018 | Kawamura et al. | |
| 2018/0061477 A1 | 3/2018 | Kawamura et al. | |
| 2018/0358083 A1 | 12/2018 | Kawamura et al. | |
| 2018/0374528 A1 | 12/2018 | Derner et al. | |
| 2019/0005999 A1 | 1/2019 | Derner et al. | |
| 2019/0013057 A1 | 1/2019 | Kawamura et al. | |
| 2019/0295623 A1 | 9/2019 | Derner et al. | |
| 2020/0005850 A1 | 1/2020 | Derner et al. | |
| 2020/0005853 A1 | 1/2020 | Kawamura et al. | |

FOREIGN PATENT DOCUMENTS

| | | |
|---|---|---|
| CN | 105742486 A | 7/2016 |
| EP | 0359404 A2 | 3/1990 |
| JP | 02113496 A | 4/1990 |
| JP | 06125066 A | 5/1994 |
| JP | 1995321228 | 12/1995 |
| JP | 2000187989 A | 7/2000 |
| JP | 2002124081 A | 4/2002 |
| JP | 2005223137 A | 8/2005 |

(56) References Cited

FOREIGN PATENT DOCUMENTS

| | | | |
|---|---|---|---|
| JP | 2006339194 A | 12/2006 | |
| JP | 2007116180 A | 5/2007 | |
| JP | 2007122874 A | 5/2007 | |
| JP | 2007266494 A | 10/2007 | |
| KR | 20010047661 A | 6/2001 | |
| KR | 20060017579 A | 2/2006 | |
| KR | 20140117902 A | 10/2014 | |
| TW | 201712910 A | 4/2017 | |
| WO | 9914761 A1 | 3/1999 | |
| WO | 0219341 A2 | 3/2002 | |
| WO | 2004109705 A2 | 12/2004 | |

OTHER PUBLICATIONS

U.S. Appl. No. 16/058,202 titled "Apparatuses and Methods Including Ferroelectric Memory and for Operating Ferroelectric Memory" filed Aug. 8, 2018.

U.S. Appl. No. 16/131,969, titled "Apparatuses and Methods Including Ferroelectric Memory and for Accessing Ferroelectric Memory", filed Sep. 14, 2018, pp. all.

U.S. Appl. No. 16/104,709 titled "Ferroelectric Memory Cells", filed Aug. 17, 2018, pp. all.

U.S. Appl. No. 16/105,631 titled "Apparatuses and Methods Including Two Transistor-One Capacitor Memory and for Accessing Same", filed Aug. 20, 2018, pp. all.

Office Action dated Apr. 29, 2019 for Taiwan application No. 107124056.

U.S. Appl. No. 16/425,769 titled "Ferroelectric Memory Cells" filed May 29, 2019.

U.S. Appl. No. 16/569,588 titled "Apparatuses and Methods Including Ferroelectric Memory and for Accessing Ferroelectric Memory" filed Sep. 12, 2019.

U.S. Appl. No. 16/569,646 titled "Apparatuses and Methods Including Ferroelectric Memory and for Operating Ferroelectric Memory" filed Sep. 12, 2019.

Henkels, W.H. et al., "Large-Signal 2T, 1C DRAM Cell: Signal and Layout Analysis", IEEE Journal of Solid-State Circuits, vol. 29, No. 7, Jul. 1994, 4 pages.

U.S. Appl. No. 16/937,402, titled "Ferroelectric Memory Cells", dated Jul. 23, 2020, pp. all.

CN Office Action dated Aug. 14, 2020 for CN Application No. 201880046438.X, pp. all.

JP Office Action dated Aug. 11, 2020 for JP Application No. 2020-500739; pp. all.

\* cited by examiner

APPARATUSES AND METHODS FOR MEMORY INCLUDING FERROELECTRIC MEMORY CELLS AND DIELECTRIC MEMORY CELLS

CROSS-REFERENCE TO RELATED APPLICATION

This application claims the filing benefit of U.S. Provisional Application No. 62/532,205, filed Jul. 13, 2017. This application is incorporated by reference herein in its entirety and for all purposes.

BACKGROUND

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored information in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile, or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. It is desirable, however, to improve the operation of FeRAM devices. For example, it may be desirable to have improved noise resistance during memory cell sensing, more compact circuits aid reduced layout size, and improved timing for operation of FeRAM devices.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
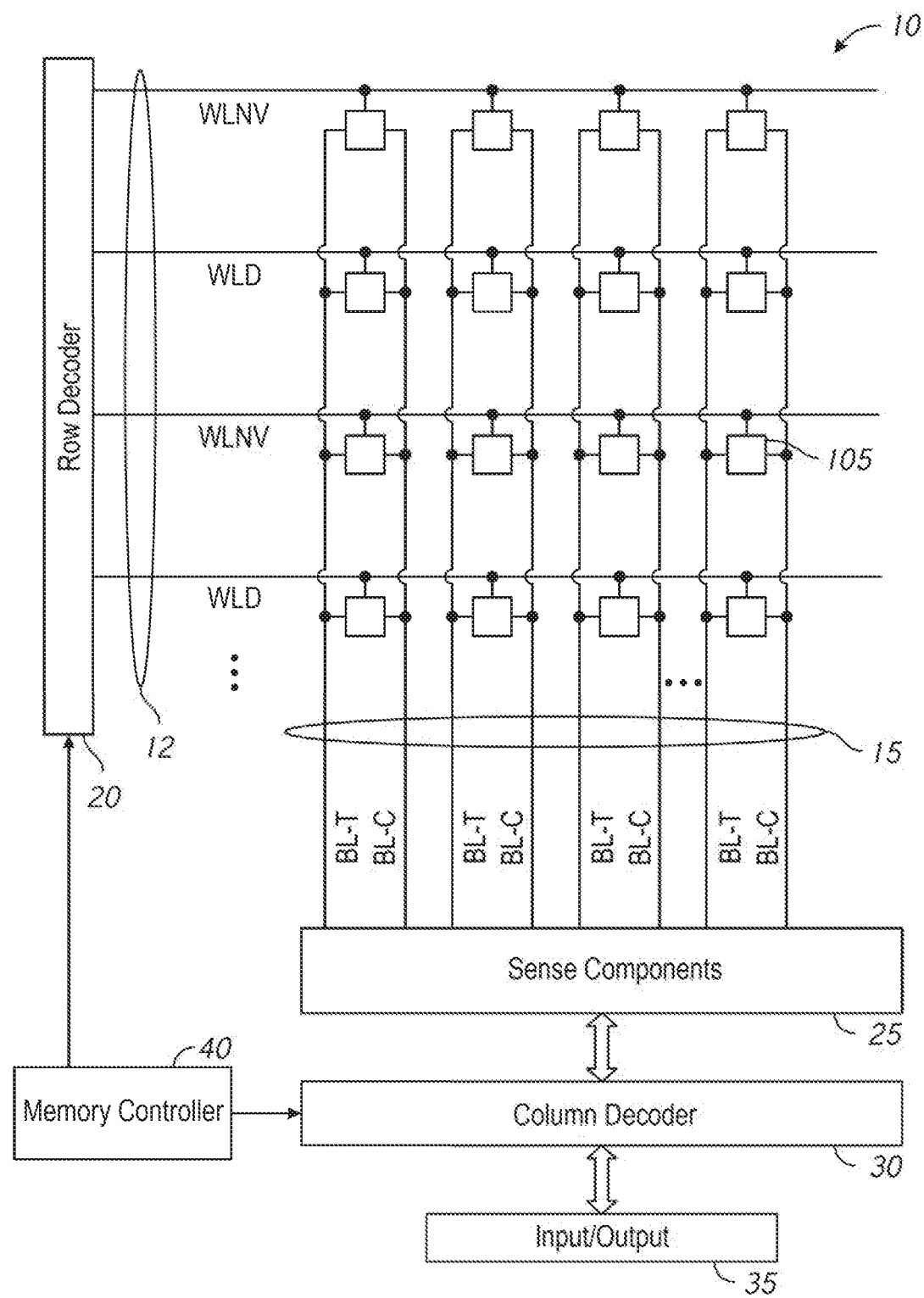
FIG. 1 is a block diagram of an example memory array that supports ferroelectric memory in accordance with various embodiments of the present disclosure.

FIG. 1 illustrates an example memory array 10 that supports a hybrid ferroelectric/dielectric memory in accordance with various embodiments of the present disclosure. Memory array 10 may also be referred to as an electronic memory apparatus. Memory array 10 includes memory cells 105 that are programmable to store different states. Each state may represent different logic values. For example, for a memory storing two states, the logic values may be denoted as a logic 0 and a logic 1. In some cases, memory cell 105 is configured to store more than two logic values. A memory cell 105 may include a plurality of capacitors to store a charge representative of the programmable states. For example, charged and uncharged capacitors may represent two logic values, respectively.

A memory cell 105 of the memory array may be either a ferroelectric memory cell or a dielectric memory cell. A ferroelectric memory cell may be configured as a non-volatile random-access memory (NVRAM) cell, which retains information when power is turned off. A dielectric memory cell may be configured as dynamic random-access memory cell (DRAM), which maintains data as long as power is applied. A ferroelectric memory cell, also referred to herein as an NVRAM memory cell, may include one or more capacitors that have a ferroelectric material disposed between opposing capacitor plates. Different levels of charge of a ferroelectric capacitor may represent different logic values. A dielectric memory cell, also referred to herein as a DRAM memory cell, may include one or more capacitors that have dielectric material disposed between opposing capacitor plates. Different levels of charge of a dielectric capacitor may represent different logic values. A ferroelectric memory cell may have beneficial properties that may result in improved performance relative to other memory architectures, for example, persistent storage of logic values without the need for periodic refresh operations. A dielectric memory cell may have beneficial properties that may result in improved performance relative to other memory architectures, for example, higher speed of memory access operations.

Operations such as reading and writing may be performed on memory cells 105 by activating or selecting the appropriate access lines 12 and sense lines 15. Access lines 12 may also be referred to as word lines 12 and sense lines may also be referred to as digit lines. Activating or selecting a word line 12 or a digit line 15 may include applying a voltage to the respective line. Word lines 12 and digit lines 15 are made of conductive materials. For example, word lines 12 and digit lines 15 may be made of metals (such as copper, aluminum, gold, tungsten, etc.), metal alloys, doped semiconductors, other conductive materials, or the like. According to the example of FIG. 1, each row of memory cells 105 is coupled to a word line 12. NVRAM memory cells 105 are coupled to word line 12 WLNV. DRAM memory cells 105 are coupled to word line 12 WLD. Each column of memory cells 105 is coupled to digit lines 15 BLT and BLC. By activating the respective word lines 12 and digit lines 15 (e.g., applying a voltage to the word lines 12 or digit lines 15), a memory cell 105 may be accessed at their intersection. Accessing the memory cell 105 may include reading or writing the memory cell 105. The intersection of a word lines 12 and digit lines 15 may be referred to as an address of a memory cell.

In some architectures, the logic storing device of a cell, e.g., capacitors, may be electrically isolated from the digit lines by selection components. A word line 12 may be coupled to and may control the selection components. For example, the selection components may be transistors and the word line 12 may be coupled to the gates of the transistors. Activating the word line 12 results in an electrical coupling or closed circuit between the capacitors of a memory cell 105 and corresponding digit line 15. The digit lines may then be accessed to either read or write the memory cell 105.

Accessing memory cells 105 may be controlled through a row decoder 20 and a column decoder 30. In some examples, a row decoder 20 receives a row address from the memory controller 40 and activates the appropriate word lines 12 based on the received row address. Similarly, a column decoder 30 receives a column address from the memory controller 40 and activates the appropriate digit lines 15. For example, memory array 10 may include multiple word lines 12, and multiple digit lines 15. Thus, by activating word line 12 WLNV and WLD and digit lines 15 BLT and BLC, the memory cell 105 at their intersection may be accessed.

Upon accessing, a memory cell 105 may be read, or sensed, by sense component 25 to determine the stored state of the memory cell 105. For example, after accessing the memory cell 105, the capacitors of memory cell 105 may discharge onto corresponding digit lines 15. Discharging the capacitors may be based on biasing, or applying a voltage, to the capacitors. The discharging may cause a change in the voltage of the digit lines 15, which sense component 25 may compare to a reference voltage (not shown) in order to determine the stored state of the memory cell 105. For example, if a digit line 15 has a higher voltage than the reference voltage, then sense component 25 may determine that the stored state in memory cell 105 is a logic 1 and vice versa. Sense component 25 may include various transistors or amplifiers in order to detect (e.g., compare) and amplify a difference in the signals, which may include latching the amplified difference. A separate sense component 25 may be provided for each pair of digit lines BLT and BLC. The detected logic state of memory cell 105 may then be output through column decoder 30 as output 35.

A memory cell 105 may be programmed, or written, by activating the relevant word lines 12 and digit lines 15. As discussed above, activating word lines 12 couples the corresponding row of memory cells 105 to their respective digit lines 15. By controlling the relevant digit lines 15 while the word lines 12 are activated, a memory cell 105 may be written—e.g., a logic value may be stored in the memory cell 105. Column decoder 30 may accept data, for example input 35, to be written to the memory cells 105. A memory cell 105 may be written by applying a voltage across the capacitor. This process is discussed in more detail below.

In some memory architectures, accessing the memory cell 105 may degrade or destroy the stored logic state, and re-write (e.g., restore) operations may be performed to return the original logic state to memory cell 105. For example, the capacitors may be partially or completely discharged during a sense operation, corrupting the stored logic state. So the logic state may be re-written after a sense operation. Additionally, activating word lines 12 may result in the discharge of all memory cells in the row. Thus, several or all memory cells 105 in the row may need to be re-written.

The memory controller 40 may control the operation (e.g., read, write, restore, etc.) of memory cells 105 through the various components, such as row decoder 20, column decoder 30, and sense component 25. Memory controller 40 may generate row and column address signals in order to activate the desired word lines 12 and digit lines 15. Memory controller 40 may also generate and control various voltage potentials used during the operation of memory array 10. In general, the amplitude, shape, or duration of an applied voltage discussed herein may be adjusted or varied and may be different for the various operations for operating memory array 10. Furthermore, one, multiple, or all memory cells 105 within memory array 10 may be accessed simultaneously. For example, multiple or all cells of memory array 10 may be accessed simultaneously during a reset operation in which all memory cells 105, or a group of memory cells 105, are set to a single logic state.

A memory cell 105 of the memory array may be either an NVRAM memory cell or a DRAM memory cell. In, accordance with various embodiments, DRAM and NVRAM memory cells may be used separately or together. In some cases, a DRAM memory cell may be paired with an NVRAM memory cell such that DRAM provides high speed access during normal operations and the NVRAM provides non-volatile storage. Here, the data stored in the DRAM cell may be backed-up to a corresponding NVRAM cell in the event power loss and so on. In other cases, the DRAM and NVRAM memory cell may be separately addressable and thus independent of each other.

Figure 2A:
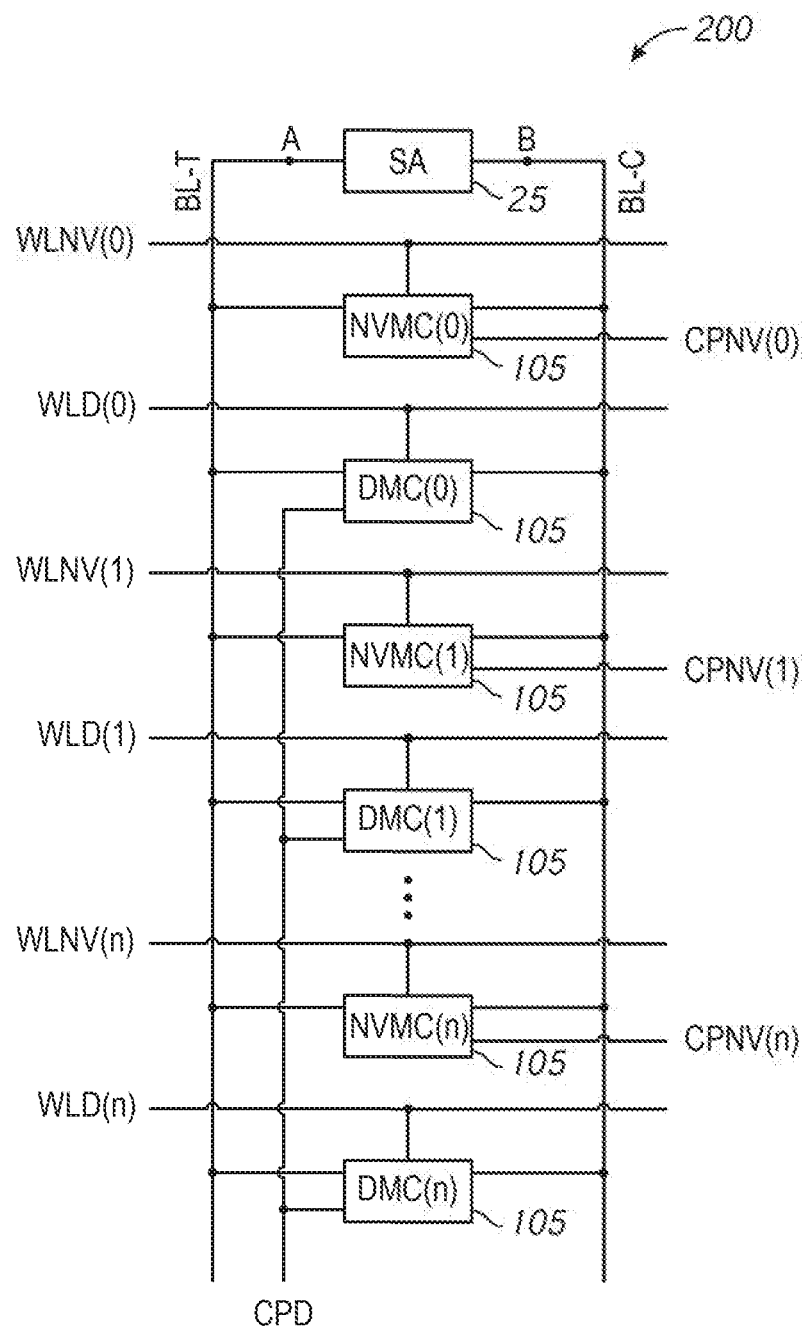
FIG. 2A is a schematic diagram of an example circuit that includes a column of memory cells according to an embodiment of the present disclosure.

FIG. 2A illustrates an example circuit 200 that includes a column of memory cells according to an embodiment of the present disclosure. FIG. 2A illustrates an example circuit 200 that includes memory cells 105 in accordance with various embodiments of the present disclosure. Circuit 200 includes NVRAM memory cells 105 NVMC(0)-NVMC(n) and DRAM memory cells DMC(0)-DMC(n), where "n" depends on the array size. The circuit 200 further includes word lines WLNV(0)-WLNV(n) and WLD(0)-WLD(n), digit lines BLT and BLC, and sense component 25. The digit line BLT is coupled to a sense node A of the sense component 25 and the digit line BLC is coupled to a sense node B of the sense component 25. The word lines, digit lines, and sense component may be examples of memory cells 105, word lines 12, digit lines 15, and sense component 25, respectively, as described with reference to FIG. 1. While one column and 2 n rows of memory cells 105 are shown in FIG. 2A, a memory array may include many columns and rows of memory cells as those shown.

Memory cells 105 may include a logic storage component, such as capacitors and selection components (not shown in FIG. 2A). In the NVRAM memory cells NVMC(0)-NVMC(n), the capacitors of the memory cells 105 may be ferroelectric capacitors. In the DRAM memory cells DMC(0)-DMC(n), the capacitors of the memory cells 105 may be dielectric capacitors. The capacitors may discharge upon coupling to digit lines BLT and BLC. As previously described, various states may be stored by charging or discharging the capacitors of the memory cell 105. The selection components of memory cell 105 may be activated by a respective word line. The NVRAM memory cells NVMC(0)-NVMC(n) may be activated by a respective word line WLNV(0)-WLNV(n). The DRAM memory cells DMC(0)-DMC(n) may be activated by a respective word line WLD(0)-WLD(n).

The NVRAM memory cells NVMC(0)—NVMC(n) may be coupled to a plate line CPNV(0)-CPNV(n) that may be used during access of the NVRAM memory cells. The DRAM memory cells DMC(0)-DMC(n) may be coupled to a plate line CPD that may be used during access of the DRAM memory cells 105. In some embodiments, the plate line CPD is tied to a constant voltage, while one or more of the plate lines CPNV(0)-CPNV(n) is coupled to a voltage driver that drives the plate lines CPNV(0)-CPNV(n) with different voltages. As described in greater detail below, the plate lines CPNV(0)-CPNV(n) may be driven with different voltages during different phases of an NVRAM write operation.

The stored state of a memory cell 105 may be read or sensed by operating various elements represented in circuit 200. Memory cell 105 may be in electronic communication with digit lines BLT and BLC. For example, as will be described in more detail below, capacitors of the memory cell 105 can be isolated from digit lines BLT and BLC when selection components of the memory cell 105 are deactivated, and the capacitors can be coupled to digit lines BLT and BLC when selection components are activated. Activating selection components of the memory cells 105 may be referred to as selecting memory cell 105. In some cases, selection components are transistors and the operation is controlled by applying voltages to the transistor gates, where the voltage magnitude is greater than the threshold voltage of the transistors. Word lines WLNV and WLD may activate the selection components. For example, a voltage applied to word line WLNV or WLD is applied to the transistor gate of the selection components of the memory cell 105. As a result, the capacitors of the selected memory cell 105 are coupled to digit lines BLT and BLC, respectively.

Word lines WLNV(0)-WLNV(n) are in electronic communication with selection components of memory cells 105 NVMC(0)-NVMC(n), respectively. Thus, activating the word line WLNV of a respective memory cell 105 NVMC may activate the memory cell 105 NVMC. For example, activating WLNV(0) activates memory cell NVMC(0), activating WLNV(1) activates, memory cell NVMC(1), and so on. Word lines WLD(0)-WLD(n) are in electronic communication with selection components of memory cells 105 DMC(0)-DMC(n), respectively. Thus, activating the word line WLH of a respective memory cell 105 DMC may activate the memory cell 105 DMC. For example, activating WLH(0) activates memory cell DMC(0), activating DLH(1) activates memory cell DMC(1), and so on.

To sense the logic value stored by a memory cell 105, the word line WLNV or WLD may be biased to activate a respective memory cell 105, and a voltage may be applied to the digit lines BLT and BLC to change a voltage of the digit lines BLT and BLC. Activation of the memory cell 105 may cause a voltage change of the digit lines BLT and BLC that is based on charge stored on the capacitors of the memory cell 105. The change in the voltage of digit lines BLT and BLC may cause a change on sense nodes A and B of the sense component 25, respectively. The resulting voltage of digit lines BLT and BLC may be compared to one another by the sense component 25 in order to determine the logic value represented by the stored state of each memory cell 105.

With regards to an NVRAM memory cell, biasing, the plate line CPNV of an activated memory cell 105 may result in a voltage difference across the capacitors of the activated memory cell 105, which may yield a change in the stored charge on the capacitors. The magnitude of the change in stored charge may depend on the initial state of each capacitor—e.g., whether the initial state stored corresponded to a logic 1 or a logic 0. When the selection components of the memory cells 105 are activated by the word line WLNV, the change in stored charge due to biasing the plate line CPNV may cause a change in the voltages of digit lines BLT and BLC based on the charge stored on the capacitors of the activated memory cell 105. With regards to a DRAM memory cell, activating the memory cell 105 may cause charge stored on the capacitors to change voltages of the digit lines BLT and BLC. As previously described, the resulting voltage of the digit lines BLT and BLC may be used to determine the logic value of the stored state of the memory cell 105.

Sense component 25 may include various transistors or amplifiers to detect and amplify a difference in signals, which may including latching the amplified difference. Sense component 25 may include a sense amplifier that receives and compares the voltage of its sense nodes (e.g., sense nodes A and B). The voltages of the sense nodes A and B may be affected by the voltages of the digit lines BLT and BLC, respectively. The sense amplifier output (e.g., sense node A) may be driven to a higher (e.g., a positive) or lower (e.g., negative or ground) supply voltage based on the comparison. The other sense node (e.g., sense node B) may be driven to a complementary voltage (e.g., the positive supply voltage is complementary to the negative or ground voltage, and the negative or ground voltage is complementary to the positive supply voltage). For instance, if the sense node A has a higher voltage than sense node B, then the sense amplifier may drive the sense node A to a positive supply voltage and drive the sense node B to a negative or ground voltage. Sense component 25 may latch the state of the sense amplifier (e.g., voltages of sense node A and/or sense node B and/or the voltages of digit lines BLT and BLC), which may be used to determine the stored state and logic value of memory cell 105, e.g., logic 1. Alternatively, the sense node A has a lower voltage than sense node B, the sense amplifier may drive the sense node A to a negative or ground voltage and drive the sense node B to a positive supply voltage. Sense component 25 may also latch the sense amplifier state for determining the stored state and the logic value of memory cell 105, e.g., logic 0.

The stored state may represent a logic value of memory cell 105, which may then be output, for example, through column decoder 30 as output 35 with reference to FIG. 1. In embodiments where the sense component 25 also drives the digit lines BLT and BLC to complementary voltages, the complementary voltages may be applied to the memory cell 105 to restore the original data state read. By restoring the data, a separate restore operation is unnecessary.

A particular memory cell 105 may be implemented with various combinations of transistors (T) and capacitors (C). Any appropriate configuration may be used in accordance with the present disclosure. For example, a particular memory cell 105 may be implemented with configurations such as 1T1C, 2T1C, 2T2C, 3T2C, 4T2C, and so on. Furthermore, different memory cells may be stacked or paired with, each other in any combination or configurations and cell types. For example, a 1T1C DRAM cell may be paired with or stacked with a 1T1C NVRAM cell, a 1T1C DRAM cell may be paired with or stacked with a 2T2C NVRAM cell, a 2T2C DRAM cell may be paired with or stacked with a 1T1C NVRAM cell, a 2T2C DRAM, cell may be paired with or stacked on a 2T2C NVRAM cell, and so on.

Figure 2B:
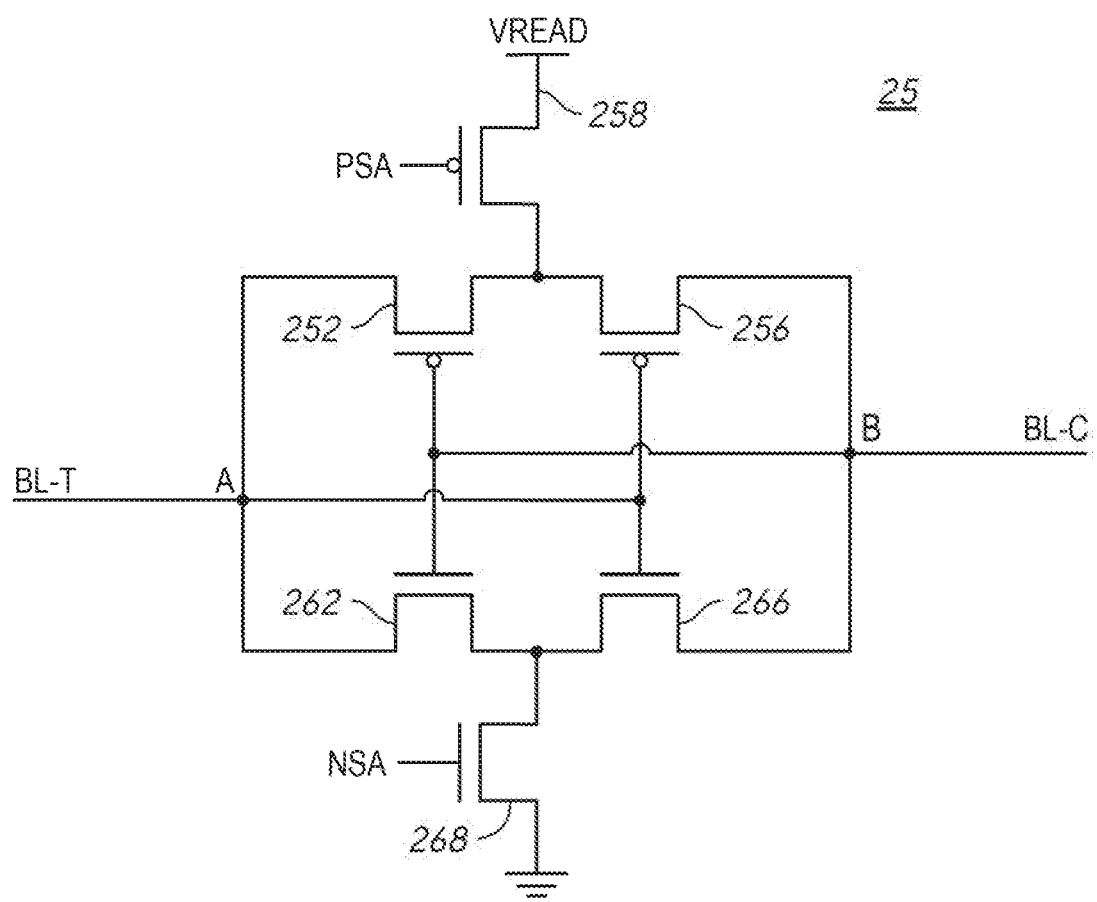
FIG. 2B is a schematic diagram of a sense component according to an embodiment of the disclosure.

FIG. 2B illustrates a sense component 25 according to an embodiment of the disclosure. The sense component 25 includes p-type field effect transistors 252 and 256 and n-type field effect transistors 262 and 266. Gates of the transistor 256 and transistor 266 are coupled to sense node A. Gates of the transistor 252 and transistor 262 are coupled to sense node B. The transistors 252 and 256, and the transistors 262 and 266 represent a sense amplifier. A p-type field effect transistor 258 is configured to be coupled to a power supply (e.g., VREAD voltage power supply) and is coupled to a common node of the transistors 252 and 255. The transistor 258 is activated by an active PSA signal (e.g., active low logic). An n-type field effect transistor 268 is configured to be coupled to a sense amplifier reference voltage (e.g., ground) and is coupled to a common node of the transistors 262 and 266. The transistor 268 is activated by an active NSA signal (e.g., active high logic).

In operation, the sense amplifier is activated by activating the PSA and NSA signals to couple the sense amplifier to the voltage of the power supply and the sense amplifier reference voltage. When activated, the sense amplifier compares the voltages of sense nodes A and B, and amplifies a voltage difference by driving the sense nodes A and B to complementary voltage levels (e.g., driving sense node A to VREAD and sense node B to ground, or driving sense node A to ground and sense node B to VREAD). When the sense nodes A and B have been driven to the complementary voltage levels, the voltages of sense nodes A and B are latched by the sense amplifier and remain latched until the sense amplifier is deactivated.

With reference to FIG. 2A, to write, memory cell 105, a voltage may be applied across the capacitors of the memory cell 105. Various methods may be used. In some examples, selection components may be activated through word lines WL, respectively, in order to couple the capacitors to digit lines BLT and BLC. For example, a voltage may be applied across capacitors of the memory cell 105 by controlling the voltage of digit lines BLT and BLC to apply a positive or negative voltage across the capacitors. In some embodiments, a complementary voltage is applied to the capacitors of the memory cell 105 to write the memory cell 105, for example, using the digit lines BLT and BLC, and plate line CP As a non-limiting example, in some embodiments, to write a first logic value to the memory cell 105 a first voltage is applied to one plate of the capacitors and a second voltage complementary to the first, voltage is applied to the other plate of the capacitors, and to write a second logic value to the memory cell 105 the second voltage is applied to the one plate of the capacitors and the first voltage is applied to the other plate of the capacitors.

In some examples, a restore operation may be performed after sensing. As previously discussed, the sense operation may degrade or destroy, the originally stored state of the memory cell 105. After sensing, the state may be written bad(to the memory cell 105, For example, sense component 25 may determine the stored state of memory cell 105 and may then write the same state back, for example, through the digit lines BLT and BLC.

Figure 3A:
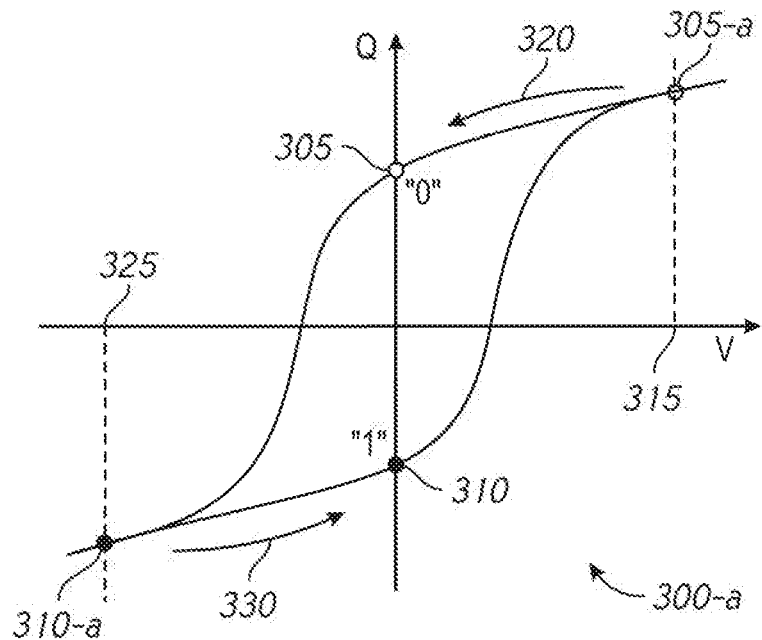
FIG. 3A and FIG. 3B are diagrams of example non-linear electrical properties for a ferroelectric memory cell in accordance with various embodiments of the present disclosure.
Figure 3B:
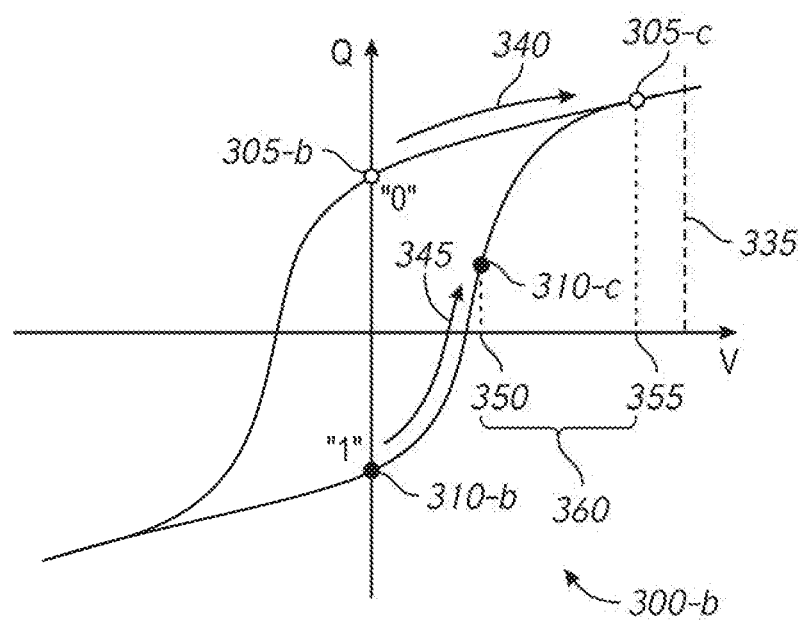

Ferroelectric materials have non-linear polarization properties. FIG. 3A and FIG. 3B illustrate examples of non-linear electrical properties with hysteresis curves 300-a (FIG. 3A) and 300-b (FIG. 3B) for a memory cell for ferroelectric memory in accordance with various embodiments of the present disclosure. Hysteresis curves 300-a and 300-b illustrate an example ferroelectric memory cell writing and reading process, respectively. Hysteresis curves 300 depict the charge, stored on a ferroelectric capacitor (e.g., the capacitor associated with a non-volatile memory cell NVMC 105 of FIG. 2A) as a function of a voltage difference, V.

A ferroelectric material is characterized by a spontaneous electric polarization, for example, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in volatile memory arrays. This may reduce the need to perform refresh operations as described above for some volatile memory architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question and maintaining the second terminal at ground (or approximately zero volts (0V)). A negative voltage may be applied by maintaining the terminal in question at ground and applying a positive voltage to the second terminal, for example, positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed without loss of understanding.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, which is the polarization (or charge) that remains upon removing the external bias (e.g., voltage).

To read, or sense, the stored state of the ferroelectric capacitor, a voltage may be applied across the capacitor. In response, the stored charge, Q, changes, and the degree of the change depends on the initial charge state, and as a result, the final stored charge (Q) depends on whether charge state 305-b or 310-b was initially stored. For example, hysteresis curve 300-b illustrates two possible stored charge states 305-b and 310-b. Voltage 335 may be applied across the capacitor as previously discussed. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line coupled to the memory cell. For example, if the capacitor is coupled to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis. Charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355 (e.g., voltage 335-voltage 350) or (e.g., voltage 335-voltage 355). A reference voltage may be generated such that its magnitude is between the two possible digit line voltages in order to determine the stored logic state, for example, if the digit line voltage is higher or lower than the reference voltage. For example, the reference voltage may be an average of the two quantities (voltage 335-voltage 350) and (voltage 335-voltage 355). In another example, the reference voltage may be provided by isolating a voltage on first sense node of a sense component, then causing a voltage change on a second sense node of the sense component through a digit line, and comparing the resulting voltage of the second sense node with the isolated voltage of the first sense node. Upon comparison by the sense component, the sensed digit line voltage may be determined to be higher or lower than the reference voltage, and the stored logic value of the ferroelectric memory cell (e.g., a logic 0 or 1) may be determined.

As mentioned, a particular memory cell 105 may be implemented with various combinations of transistors (T) and capacitors (C) and any appropriate configuration may be used in accordance with the present disclosure. For example, a particular memory cell 105 may be implemented with configurations such as 1T1C, 2T1C, 2T2C, 3T2C, 4T2C, and so on. Furthermore, different memory cells may be stacked or paired with each other in any combination or configurations and cell types. In order to more particularly describe the operation of memory cells 105 in accordance with embodiments of the present disclosure, the following discussion references 2T2C and 1T1C memory cells by way of example and not limitation. It should be appreciated that the operations discussed below are specific examples of concepts that may be applied more generally to any memory cell configuration used to implement a memory cell 105 embodiment.

Figure 4A:
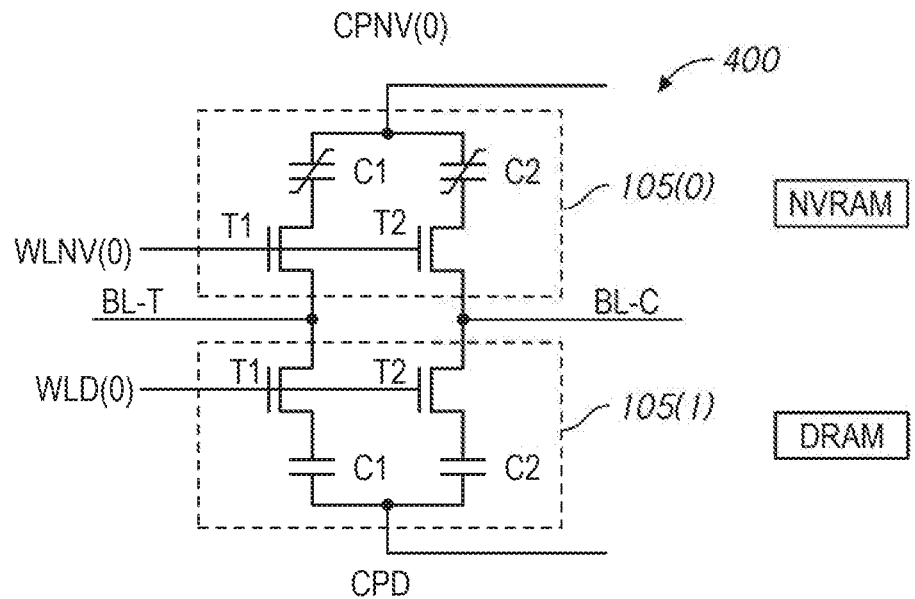
FIG. 4A is a schematic diagram of example memory cells including two transistors and two capacitors according to an embodiment of the disclosure.

FIG. 4A is a schematic diagram of an example circuit 400 that includes two memory cells 105(0) and 105(1) according to an embodiment of the disclosure. A dashed line demarcates an approximate boundary of the memory cell 105. Each of the memory cells 105 includes two selection components T1 and T2 and two capacitors C1 and C2. The capacitors C1 and C2 of the first memory cell 105(0) may be ferroelectric capacitors. The capacitors C1 and C2 of the second memory cell 105(1) may be dielectric capacitors. The selection components T1 and T2 of two memory cells 105(0) and 105(1) may be transistors, for example, n-type field effect transistors. In such an example, each of the memory cells 105 includes two transistors and two capacitors (e.g., 2T2C).

Operation of the selection components T1 and T2 is controlled by applying voltages to the transistor gates. A respective word line may activate the selection components. WLNV(0) may activate the selection components T1 and T2 of memory cell 105(0). WLD(0) may activate the selection components T1 and T2 of memory cell 105(1). The capacitor C1 has a first plate and a second plate. In the first memory cell 105(0), the first plate of capacitor C1 is coupled to the plate line CPNV(0). In the second memory cell 105(1), the first plate of capacitor C1 is coupled to the plate line CPD. The capacitor C2 has a first plate and a second plate. In the first memory cell 105(0), the first plate of capacitor C2 is coupled to the plate line CPNV(0). In the second memory cell 105(1), the first plate of capacitor C2 is coupled to the plate line CPD. In the first and second memory cells 105(0) and 105(1), the second plate of the capacitor C1 is coupled to the selection component T1 and the second plate of the capacitor C2 is coupled to the selection component T2. The selection component T1 is further coupled to a digit line BLT and the selection component T2 is further coupled to a digit line BLC.

When activated, such as by respective word lines (e.g, WLNV(0) for the memory cell 105(0), and WLD(0) for the memory cell 105(1)), the second plate of the capacitor C1 and the second plate of the capacitor C2 are coupled to the digit lines BLT and BLC, respectively. As previously discussed, when coupled to the digit lines BLT and BLC, the memory cells 105 may be accessed. For example, a stored state of the memory cells 105 may be read and/or the memory cells 105 may be written to store a new state or the same state. Various voltages, for example, complementary voltages in some embodiments, may be applied to the plates of the capacitor C1 and C2 over the digit lines BLT and BLC and the plate line CP to access (e.g., read and/or write) the memory cells 105. In some embodiments, the plate line CPD is tied to a constant voltage, while the plate line CPNV is, coupled to a voltage driver that drives the plate lines CPNV with different voltages. The plate line CPNV may be driven with different voltages during different phases of an NVRAM write operation.

Figure 4B:
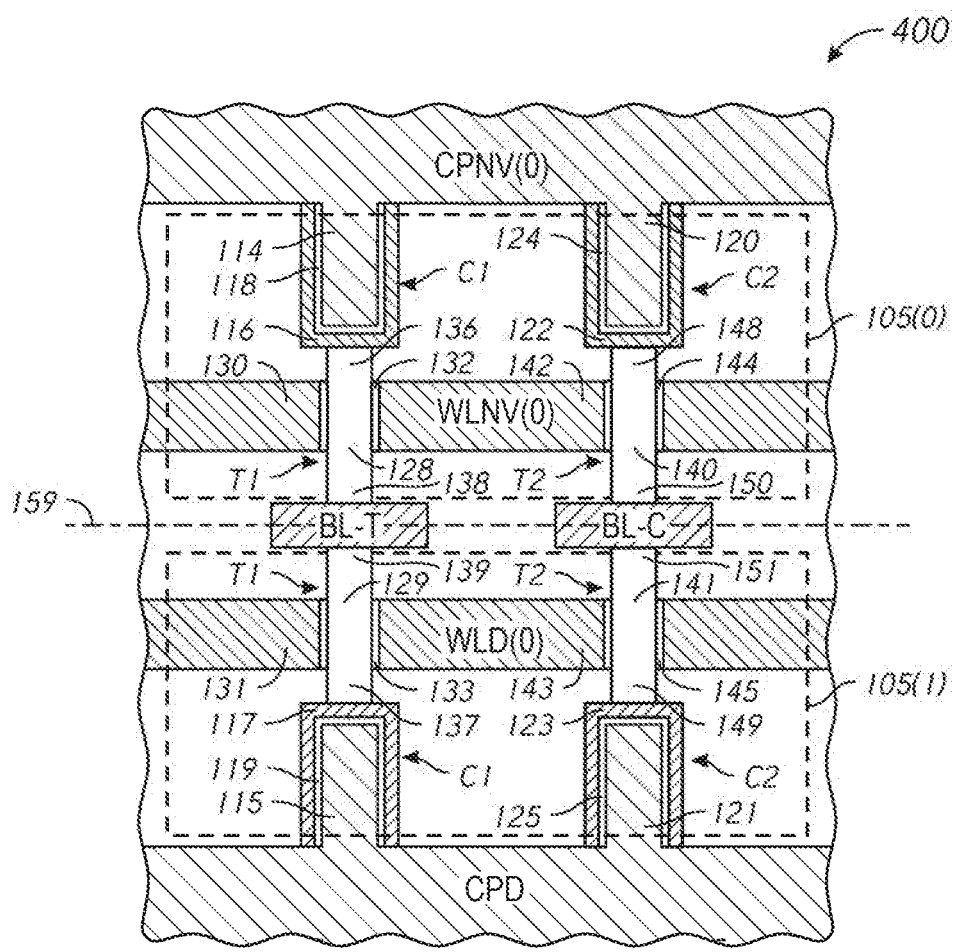
FIG. 4B is a diagrammatic cross-sectional side view of a region of an example memory array showing example memory cells including two transistors and two capacitors according to an embodiment of the disclosure.

FIG. 4B shows a portion of a memory array 10 including the example circuit 400 of FIG. 4A according to an embodiment of the disclosure. In the embodiment of FIG. 4B, the memory cell 105(0) is vertically stacked over the memory cell 105(1). A dashed line demarcates an approximate boundary of the memory cells 105(0) and 105(1). In some embodiments the memory cells 105 of FIG. 4A may be considered to comprise memory cells within an 8F2 architecture, where F indicates a minimum features size of a given technology.

The illustrated portion of memory array 10 is supported by a base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base may correspond to a semiconductor substrate containing one or more materials associated with integrated circuit fabrication. Such materials may include, for example, one or more of refractory metal materials, barrier materials, diffusion materials, insulator materials, etc.

The memory cells 105(0) and 105(1) are in a common column as one another within the memory array. Digit lines BLT and BLC are between the memory cells 105(0) and 105(1), and extend in and out of the page relative to the cross-section of FIG. 4B. The digit lines BLT and BLC may be coupled with a sense component 25 of the type previously described with reference to FIGS. 1 and 2. The digit lines BLT and BLC are shared by the memory cells 105(0) and 105(1).

The memory cell 105(0) comprises first and second transistors T1 and T2 which are laterally displaced relative to one another. The memory cell 105(0) comprises the first capacitor C1 above the first transistor T1, and comprises the second capacitor C2 above the second transistor T2. The first transistor T1 is vertically displaced relative to the first capacitor C1 and the second transistor T2 is vertically displaced relative to the second capacitor C2. The first capacitor C1 comprises a first plate 114, a second plate 116, and ferroelectric material 118 between the first and second plates 114 and 116. The second capacitor C2 comprises a first plate 120, a second plate 122, and ferroelectric material 124 between the first and second plates 120 and 122.

In the shown embodiment the second plates 116 and 122 are container-shaped outer plates, and the first plates 114 and 120 are inner plates which extend into the container-shaped outer plates. In other embodiments the second plates 116 and 122 may have other configurations, and the first plates 114 and 120 may also have other configurations.

The first plates 114 and 120 are coupled with a plate line structure CPNV(0) provided above the first and second capacitors C1 and C2 of the memory cell 105(0). In the illustrated embodiment the first plates 114 and 120 share a common composition with the plate line structure CPNV(0). In other embodiments, the plate line structure CPNV(0) may comprise a different composition as compared to the first plates 114 and 120.

The first and second capacitors C1 and C2 are laterally displaced relative to one another, and in the shown embodiment are in a same horizontal plane as one another (i.e., are horizontally aligned with one another). The first transistor T1 is between the first capacitor C1 and the digit line BLT, and the second transistor T2 is between the second capacitor C2 and the digit line BLC. In the shown embodiment the first and second transistors T1 and T2 are in a common horizontal plane as one another, and the word line WLNV(0) extends along such horizontal plane, and comprises the gates 130 and 142 of the first and second transistors T1 and T2.

A first semiconductor pillar 128 extends upwardly from the digit line BLT to the second plate 116 of the first capacitor C1, and the first transistor T1 is along such first semiconductor pillar. A second semiconductor pillar 140 extends upwardly from the digit line BLC to the second plate 122 of the second capacitor C2, and the second transistor T2 is along the second semiconductor pillar 140.

The first transistor T1 includes the gate dielectric material 132, and further includes the first channel region within the semiconductor pillar 128 and along the gate dielectric material 132, and source/drain regions 136 and 138 within the semiconductor pillar and on opposing sides of the channel region. The source/drain region 136 is coupled with the second plate 116 of first capacitor C1, and the source/drain region 138 is coupled with the digit line BLT. The second transistor T2 includes the gate dielectric material 144, and further includes the second channel region within the semiconductor pillar 140 and along the gate dielectric material 144, and source/drain regions 148 and 150 within the semiconductor pillar and on opposing sides of the channel region. The source/drain region 148 is coupled with the second plate 122 of second capacitor C2, and the source/drain region 150 is coupled with the digit line BLC.

The memory cell 105(1) comprises first and second transistors T1 and T2 which are laterally displaced relative to one another. The memory cell 105(1) comprises the first capacitor C1 below the first transistor T1, and comprises the second capacitor C2 below the second transistor T2. The first transistor T1 is vertically displaced relative to the first capacitor C1 and the second transistor T2 is vertically displaced relative to the second capacitor C2. The first capacitor C1 comprises a first plate 115, a second plate 117, and dielectric material 119 between the first and second plates 115 and 117. The second capacitor C2 comprises a first plate 121, a second plate 123, and dielectric material 125 between the first and second plates 121 and 123.

In the shown embodiment the second plates 117 and 123 are container-shaped outer plates, and the first plates 115 and 121 are inner plates which extend into the container-shaped outer plates. In other embodiments the second plates 117 and 123 may have other configurations, and the first plates 115 and 121 may also have other configurations, in one example, the first plates 115 and 121 (coupled to the plate line CPD) may be container-shaped and the second plates 117 (coupled to the pillar 129 including the source/drain region 137) and 123 (coupled to the pillar 141 including the source/drain region 149) may be inner plates, which extend into the container-shaped outer plates.

The first plates 115 and 121 are coupled with a plate line structure CPD provided below the first and second capacitors C1 and C2 of the memory cell 105(1). In the illustrated embodiment the first plates 115 and 121 share a common composition with the plate line structure CPD. In other embodiments the plate line structure CPD may comprise a different composition as compared to the first plates 115 and 121.

The first and second capacitors C1 and C2 are laterally displaced relative to one another, and in the shown embodiment are in a same horizontal plane as one another (i.e., are horizontally aligned with one another). The first transistor T1 is between the first capacitor C1 and the digit line BLT, and the second transistor T2 is between the second capacitor C2 and the digit line BLC. In the shown embodiment the first and second transistors T1 and T2 are in a common horizontal plane as one another, and the word line WLD(0) extends along such horizontal plane and comprises the gates 131 and 143 of the first and second transistors T1 and T2.

A first semiconductor pillar 129 extends downwardly from the digit line BLT to the second plate 117 of the first capacitor C1, and the first transistor T1 is along such first semiconductor pillar. A second semiconductor pillar 141 extends downwardly from the digit line BLC to the second plate 123 of the second capacitor C2, and the second transistor T2 is along the second semiconductor pillar 141.

The first transistor T1 includes the gate dielectric material 133, and further includes the first channel region within the semiconductor pillar 129 and along the gate dielectric material 133, and source/drain regions 137 and 139 within the semiconductor pillar and on opposing sides of the channel region. The source/drain region 137 is coupled with the second plate 117 of first capacitor C1, and the source/drain region 139 is coupled with the digit line BLT. The second transistor T2 includes the gate dielectric material 145, and further includes the second channel region within the semiconductor pillar 141 and along the gate dielectric material 145, and source/drain regions 149 and 151 within the semiconductor pillar and on opposing sides of the channel region. The source/drain region 149 is coupled with the second plate 123 of second capacitor C2, and the source/drain region 151 is coupled with the digit line BLC.

In the illustrated embodiment the digit line BLT and BLC are in a common horizontal plane as one another. An axis 159 extending through the digit lines BLT and BLC may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement.

Figure 5A:
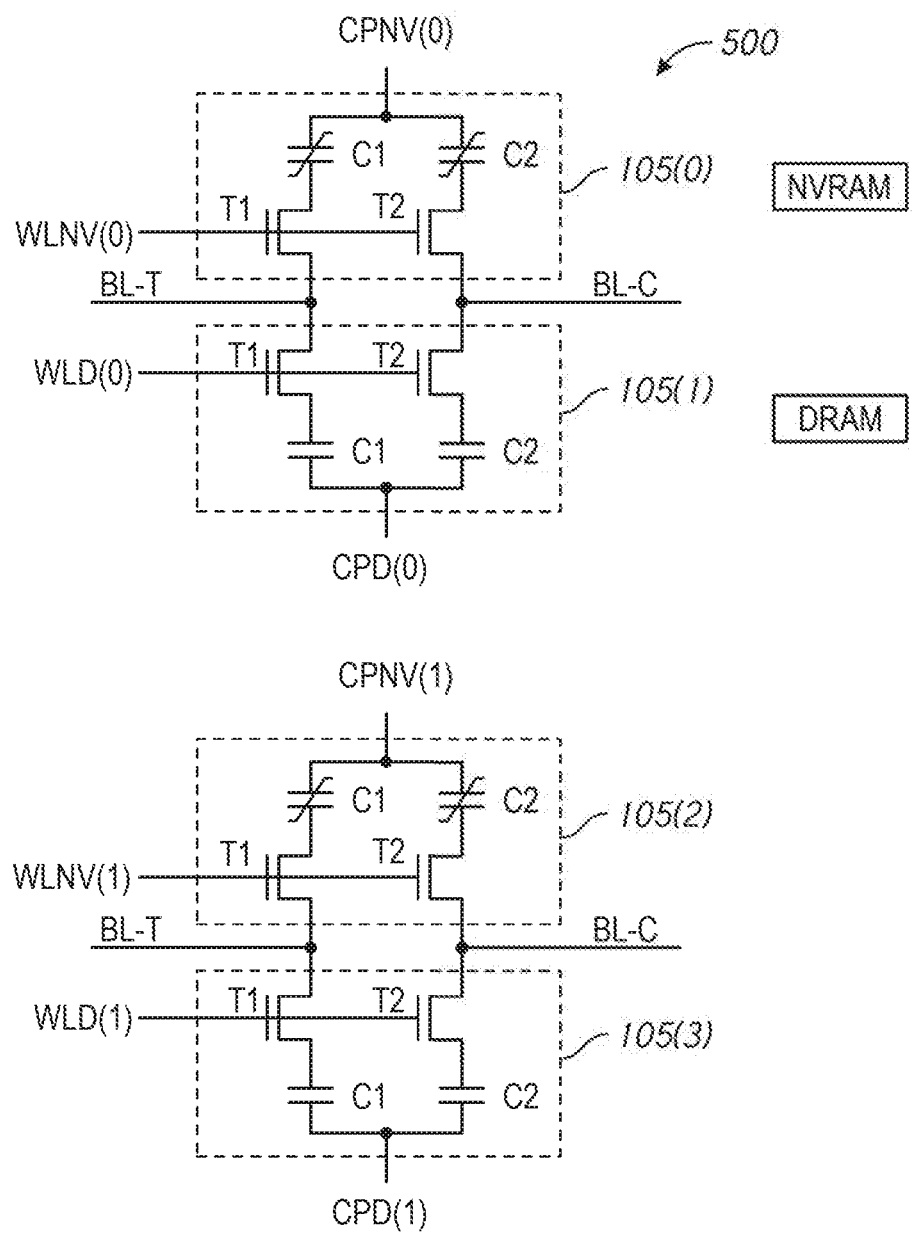
FIG. 5A is a schematic diagram of example memory cells including two transistors and two capacitors according to an embodiment of the disclosure.
Figure 5B:
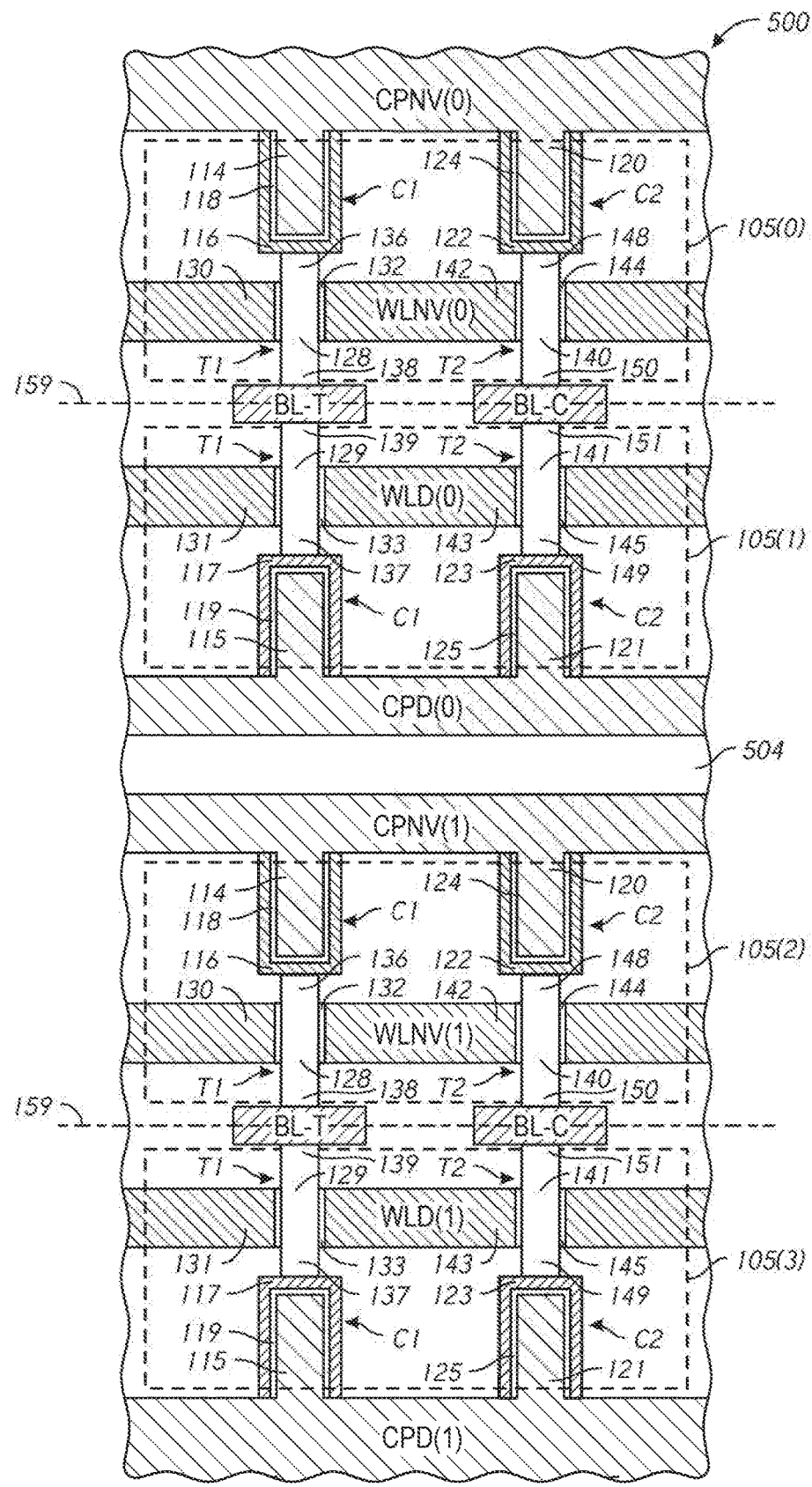
FIG. 5B is a diagrammatic cross-sectional side view of a region of an example memory array showing example memory cells including two transistors and two capacitors according to an embodiment of the disclosure.

FIG. 5A is a schematic diagram of an example circuit 500 that includes four memory cells 105(0)-105(3) according to an embodiment of the disclosure. FIG. 5B shows portion of a memory array 10 including the example circuit 500 of FIG. 5A according to an embodiment of the disclosure. The example circuit 500 of FIG. 5A and FIG. 5B includes two of the example circuits 400 of FIG. 4A and FIG. 4B arranged in a stacked configuration. A dashed line demarcates an approximate boundary of the memory cell 105. Each of the memory cells 105 includes two selection components T1 and T2 and two capacitors C1 and C2. The capacitors C1 and C2 of the first and third memory cells 105(0) and 105(2) may be ferroelectric capacitors. The capacitors C1 and C2 of the second and fourth memory cells 105(1) and 105(2) may be dielectric capacitors. The selection components T1 and T2 of four memory cells 105(0)-105(3) may be transistors, for example, n-type field effect transistors. In such an example, each of the memory cells 105 includes two transistors and two capacitors (e.g., 2T2C). The memory cells 105(0) and 105(1) may operate as described above in connection with FIG. 4A and FIG. 4B. Similarly, the memory cells 105(2) and 105(3) may operate as described above in connection with FIG. 4A and FIG. 4B. The stacked configuration of the example circuit 500 may include an isolation layer 504 (shown in FIG. 5B) that includes an insulator, dielectric, or other appropriate material that functions to isolate memory cell 105(1) from memory cell 105(2).

Figure 6A:
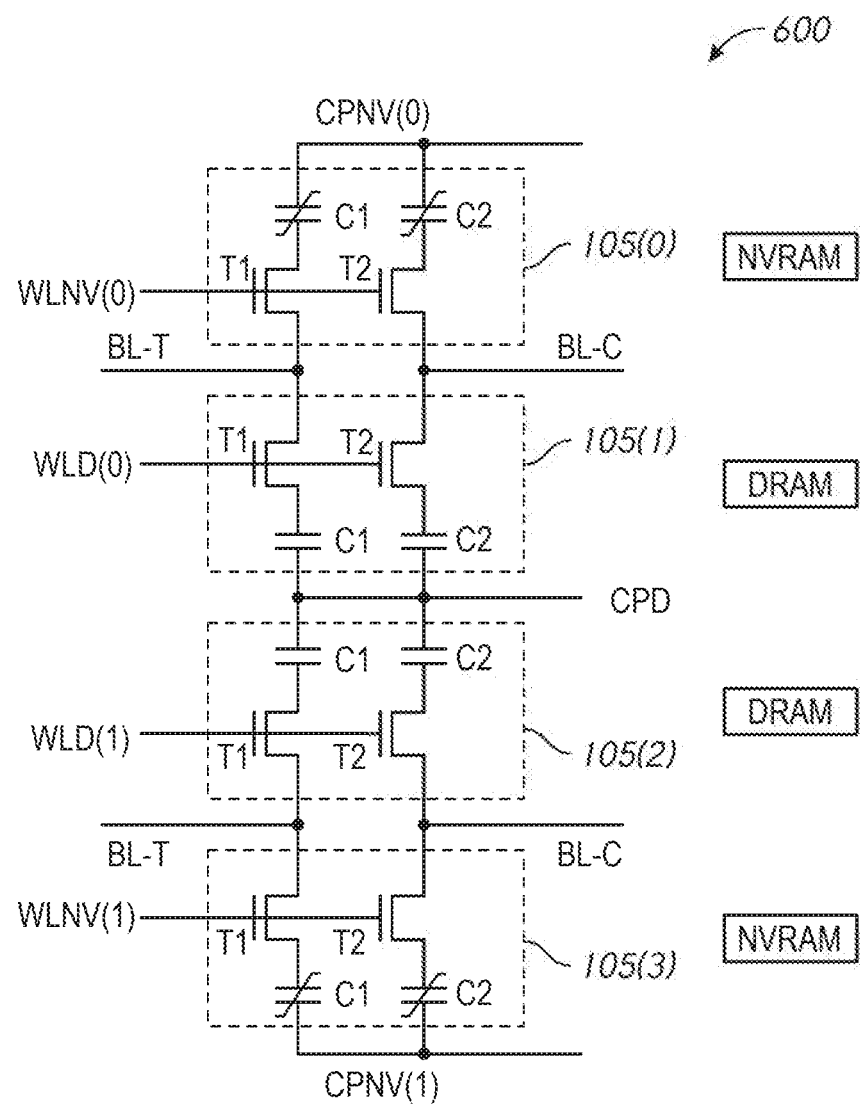
FIG. 6A is a schematic diagram of example memory cells including two transistors and two capacitors according to an embodiment of the disclosure.

FIG. 6A is a schematic diagram of an example circuit 500 that includes four memory cells 105(0)-105(3) according to an embodiment of the disclosure. A dashed line demarcates an approximate boundary of the memory cell 105. Each of the memory cells 105 includes two selection components T1 and T2 and two capacitors C1 and C2. The capacitors C1 and C2 of the first and fourth memory cells 105(0) and 105(3) may be ferroelectric capacitors. The capacitors C1 and C2 of the second and third memory cells 105(1) and 105(2) may be dielectric capacitors. The selection components T1 and T2 of four memory cells 105(0)-105(3) may be transistors, for example, n-type field effect transistors. In such an example, each of the memory cells 105 includes two transistors and two capacitors (e.g., 2T2C).

Operation of the selection components T1 and T2 is controlled by applying voltages to the transistor gates. A respective word line may activate the selection components. WLNV(0) may activate the selection components T1 and T2 of memory cell 105(0). WLD(0) may activate the selection components T1 and T2 of memory cell 105(1). WLD(1) may activate the selection components T1 and T2 of memory cell 105(2) WLNV(1) may activate the selection components T1 and T2 of memory cell 105(3).

The capacitor C1 has a first plate and a second plate. In the first memory cell 105(0), the first plate of capacitor C1 is coupled to the plate line CPNV(0). In the second memory cell 105(1), the first plate of capacitor C1 is coupled to the plate line CPD. In the third memory cell 105(2), the first plate of capacitor C1 is coupled to the plate line CPD. In the fourth memory cell 105(3), the first plate of capacitor C1 is coupled to the plate line CPNV(1).

The capacitor C2 has a first plate and a second plate. In the first memory cell 105(0), the first plate of capacitor C2 is coupled to the plate line CPNV(0). In the second memory cell 105(1), the first plate of capacitor C2 is coupled to the plate line CPD. In the third memory cell 105(2), the first plate of capacitor C2 is coupled to the plate line CPD. In the fourth memory cell 105(3), the first plate of capacitor C2 is coupled to the plate line CPNV(1).

In the first through fourth memory cells 105(0)-105(3), the second plate of the capacitor C1 is coupled to the selection component T1 and the second plate of the capacitor C2 is coupled to the selection component T2. In the first and second memory cells 105(0) and 105(1), the selection component T1 is further coupled to an upper digit line BLT and the selection component T2 is further coupled to an upper digit line BLC. In the third and fourth memory cells 105(2) and 105(3), the selection component T1 is further coupled to a lower digit line BLT and the selection component T2 is further coupled to lower digit line BLC.

When activated, such as by respective word lines (e.g. WLNV(o) for the memory cell 105(0). WLD(0) for the memory cell 105(1). WLNV(1) for the memory cell 105(2), and WLD(1) for the memory cell 105(3)), the second plate of the capacitor C1 and the second plate of the capacitor C2 are coupled to the digit lines BLT and BLC, respectively. As previously discussed, when coupled to the digit lines BLT and BLC, the memory cells 105 may be accessed. For example, a stored state of the memory cells 105 may be read and/or the memory cells 105 may be written to store a new state or the same state. Various voltages, for example, complementary voltages in some embodiments, may be applied to the plates of the capacitor C1 and C2 over the digit lines BLT and BLC and the plate line CP to access (e.g., read and/or write) the memory cells 105. In some embodiments, the plate line CPD is tied to a constant voltage, while the plate line CPNV is coupled to a voltage driver that drives the plate lines CPNV with different voltages. The plate line CPNV may be driven with different voltages during different phases of an NVRAM write operation.

Figure 6B:
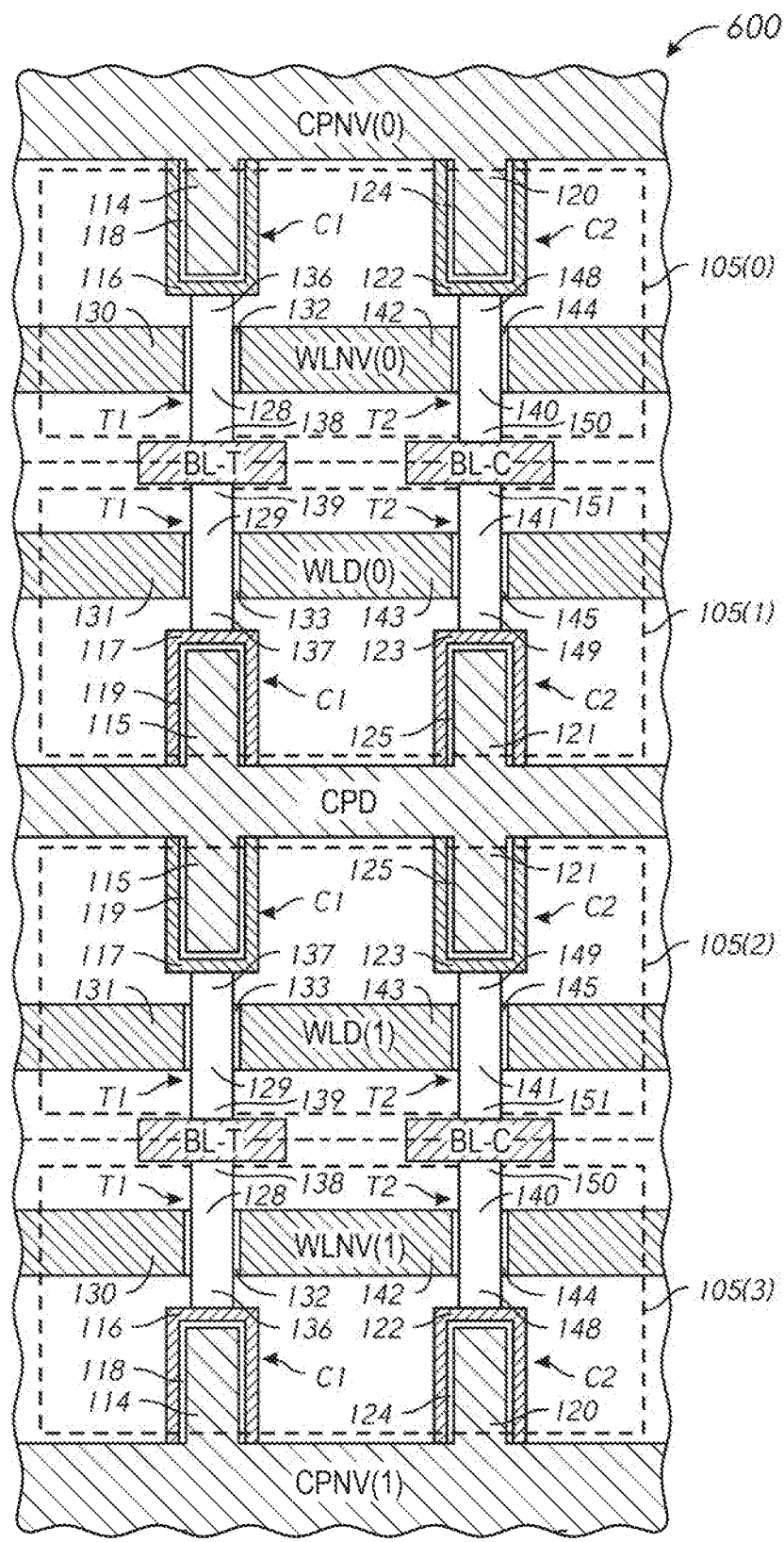
FIG. 6B is a diagrammatic cross-sectional side view of a region of an example memory array showing example memory cells including two transistors and two capacitors according to an embodiment of the disclosure.

FIG. 6B shows a portion of a memory array 10 including the example circuit 600 of FIG. 6A according to an embodiment of the disclosure. In the embodiment of FIG. 6B, the memory cell 105(0) is vertically stacked over the memory cell 105(1), which is vertically stacked over memory cell 105(2), which is vertically stacked over memory cell 105(3). A dashed line demarcates an approximate boundary of the memory cells 105(0)-105(3). In some embodiments, the memory cells 105 of FIG. 6A may be considered to comprise memory cells within an 8F2 architecture, where F indicates a minimum features size of a given technology.

The illustrated portion of memory array 10 may be supported by a base (not shown) analogous to the base of FIG. 4B. The memory cells 105(0) and 105(1) are in a common column as one another within the memory array. Upper digit lines BLT and BLC are between the memory cells 105(0) and 105(1), and extend in and out of the page relative to the cross-section of FIG. 6B. Similarly, lower digit lines BLT and BLC are between the memory cells 105(2) and 105(3), and extend in and out of the page relative to the cross-section of FIG. 6B. The digit lines BLT and BLC may be coupled with a sense component 25 of the type previously described with reference to FIGS. 1, 2A and 2B. The upper digit lines BLT and BLC are shared by the memory cells 105(0) and 105(1). The lower digit lines BLT and BLC are shared by the memory cells 105(2) and 105(3).

The first and fourth memory cells 105(0) and 105(3) each comprise first and second transistors T1 and T2, which are laterally displaced relative to one another. The first memory cell 105(0) comprises the first capacitor C1 above the first transistor T1, and comprises the second capacitor C2 above the second transistor T2. The fourth memory cell 105(3) comprises the first capacitor C1 below the first transistor T1, and comprises the second capacitor C2 belay the second transistor T2. In the first and fourth memory cells 105(0) and 105(3), the first transistor T1 is vertically displaced relative to the first capacitor C1 and the second transistor T2 is vertically displaced relative to the second capacitor C2. The first capacitor C1 comprises a first plate 114, a second plate 116, and ferroelectric material 118 between the first and second plates 114 and 116. The second capacitor C2 comprises a first plate 120, a second plate 122, and ferroelectric material 124 between the first and second plates 120 and 122.

In the shown embodiment the second plates 116 and 122 are container-shaped outer plates, and the first plates 114 and 120 are inner plates which extend into the container-shaped outer plates. In other embodiments the second plates 116 and 122 may have other configurations, and the first plates 114 and 120 may also have other configurations.

In the first memory cell 105(0), the first plates 114 and 120 are coupled with a plate line structure CPNV(0) provided above the first and second capacitors C1 and C2 of the memory cell 105(0). In the second memory cell 105(0), the first plates 114 and 120 are coupled with a plate line structure CPNV(1) provided below the first and second capacitors C1 and C2 of the memory cell 105(0). In the illustrated embodiment the first plates 114 and 120 share a common composition with the plate line structures CPNV(0) and CPNV(1), other embodiments, the plate line structures CPNV(0) and CPNV(1) may comprise a different composition as compared to the first plates 114 and 120.

The first and second capacitors C1 and C2 are laterally displaced relative to one another, and in the shown embodiment are in a same horizontal plane as one another (i.e., are horizontally aligned with one another). The first transistor T1 is between the first capacitor C1 and the digit line BLT, and the second transistor T2 is between the second capacitor C2 and the digit line BLC. In the shown embodiment the first and second transistors T1 and T2 are in a common horizontal plane as one another. In the first memory cell 105(0), the word line WLNV(0) extends along such horizontal plane and comprises the gates 130 and 142 of the first and second transistors T1 and T2. In the fourth memory cell 105(3), the word line WLNV(1) extends along such horizontal plane and comprises the gates 130 and 142 of the first and second transistors T1 and T2.

In the first memory cell 105(0), a first semiconductor pillar 128 extends upwardly from the digit line BLT to the second plate 116 of the first capacitor C1, and the first transistor T1 is along such first semiconductor pillar. A second semiconductor pillar 140 extends upwardly from the digit line BLC to the second plate 122 of the second capacitor C2, and the second transistor T2 is along the second semiconductor pillar 140. In the fourth memory cell 105(4), a first semiconductor pillar 128 extends downwardly from the digit line BLT to the second plate 116 of the first, capacitor C1 and the first transistor T1 is along such first semiconductor pillar. A second semiconductor pillar 140 extends downwardly from the digit line BLC to the second plate 122 of the second capacitor C2, and the second transistor T2 is along the second semiconductor pillar 140.

In the first and fourth memory cells 105(0) and 105(3), the first transistor T1 includes the gate dielectric material 132, and further includes the first channel region within the semiconductor pillar 128 and along the gate dielectric material 132, and source/drain regions 136 and 138 within the semiconductor pillar and on opposing sides of the channel region. The source/drain region 136 is coupled with the second plate 116 of first capacitor C1, and the source/drain region 138 is coupled with the digit line BLT. The second transistor T2 includes the gate dielectric material 144, and further includes the second channel region within the semiconductor pillar 140 and along the gate dielectric material 144, and source/drain regions 148 and 150 within the semiconductor pillar and on opposing sides of the channel region. The source/drain region 148 is coupled with the second plate 122 of second capacitor C2, and the source/drain region 150 is coupled with the digit line BLC.

The second and third memory cells 105(1) and 105(2) each comprise first and second transistors T1 and T2 which are laterally displaced relative to one another. The second memory cell 105(1) comprises the first capacitor C1 below the first transistor T1, and comprises the second capacitor C2 below the second transistor T2. The third memory cell 105(2) comprises the first capacitor C1 above the first transistor T1, and comprises the second capacitor C2 above the second transistor T2. In the second and third memory cells 105(1) and 105(2), the first transistor T1 is vertically displaced relative to the first capacitor C1 and the second transistor T2 is vertically displaced relative to the second capacitor C2. The first capacitor C1 comprises a first plate 115, a second plate 117, and dielectric material 119 between the first and second plates 115 and 117. The second capacitor C2 comprises a first plate 121, a second plate 123, and dielectric material 125 between the first and second plates 121 and 123.

In the shown embodiment the second plates 117 and 123 are container-shaped outer plates, and the first plates 115 and 121 are inner plates which extend into the container-shaped outer plates. In other embodiments the second plates 117 and 123 may have other configurations, and the first plates 115 and 121 may also have other configurations. In one example, the first plates 115 and 121 (coupled to the plate line CPD) may be container-shaped and the second plates 117 (coupled to the pillar 129 including the source/drain region 137) and 123 (coupled to the pillar 141 including the source/drain region 149) may be inner plates, which extend into the container-shaped outer plates.

In the second memory cell 105(1), the first plates 115 and 121 are coupled with a plate line structure CPD provided below the first and second capacitors C1 and C2 of the memory cell 105(1). In the third memory cell 105(2), the first plates 115 and 121 are coupled with a plate line structure CPD provided above the first and second capacitors C1 and C2 of the memory cell 105(1). In the illustrated embodiment the first plates 115 and 121 share a common composition with the plate line structure CPD In other embodiments the plate line structure CPD may comprise a different composition as compared to the first plates 115 and 121.

The first and second capacitors C1 and C2 are laterally displaced relative to one another, and in the shown embodiment are in a same horizontal plane as one another (i.e., are horizontally aligned with one another). The first transistor T1 is between the first capacitor C1 and the digit line BLT, and the second transistor T2 is between the second capacitor C2 and the digit line BLC. In the shown embodiment the first and second transistors T1 and T2 are in a common horizontal plane as one another. In the second memory cell 105(1), the word line WLD(0) extends along such horizontal plane and comprises the gates 131 and 143 of the first and second transistors T1 and T2. In the third memory cell 105(2), the word line WLD(i) extends along such horizontal plane and comprises the gates 131 and 143 of the first and second transistors T1 and T2.

In the second memory cell 105(1), a first semiconductor pillar 129 extends downwardly from the digit line BLT to the second plate 117 of the first capacitor C1, and the first transistor T1 is along such first semiconductor pillar. A second semiconductor pillar 141 extends downwardly from the digit line BLC to the second plate 123 of the second capacitor C2, and the second transistor T2 is along the second semiconductor pillar 141. In the third memory cell 105(2), a first semiconductor pillar 129 extends upwardly from the digit line BLT to the second plate 117 of the first capacitor C1, and the first transistor T1 is along such first semiconductor pillar. A second semiconductor pillar 141 extends upwardly from the digit line BLC to the second plate 123 of the second capacitor C2, and the second transistor T2 is along the second semiconductor pillar 141.

In the second and third memory cells 105(1) and 105(2), the first transistor T1 includes the gate dielectric material 133, and further includes the first channel region within the semiconductor pillar 129 and along the gate dielectric material 133, and source/drain regions 137 and 139 within the semiconductor pillar and on opposing sides of the channel region. The source/drain region 137 is coupled with the second plate 117 of first capacitor C1, and the source/drain region 139 is coupled with the digit line BLT. The second transistor T2 includes the gate dielectric material 145, and further includes the second channel region within the semiconductor pillar 141 and along the gate dielectric material 145, and source/drain regions 149 and 151 within the semiconductor pillar and on, opposing sides of the channel region. The source/drain region 149 is coupled with the second plate 123 of second capacitor C2, and the source/drain region 151 is coupled with the digit line BLC.

In the illustrated embodiment the digit line BLT and BLC are in a common horizontal plane as one another. An axis 159 extending through the digit lines BLT and BLC may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement. The present disclosure includes descriptions and illustrations of memories that include certain configurations and arrangements of memory cells and memory cell layers by way of example and not limitation. It should be appreciated that the various DRAM/NVRAM cells and/or layers may be arranged differently or that a memory in accordance with the present disclosure may have greater or fewer DRAM/NVRAM cells and/or layers than the described examples. For example, memory configuration in accordance with the present disclosure may include memories having a lower DRAM layer and an upper NVRAM layer, memories having unequal numbers of DRAM and NVRAM cells, memories having adjacent and/or non-adjacent DRAM and NVRAM cells, and so on.

Figure 7A:
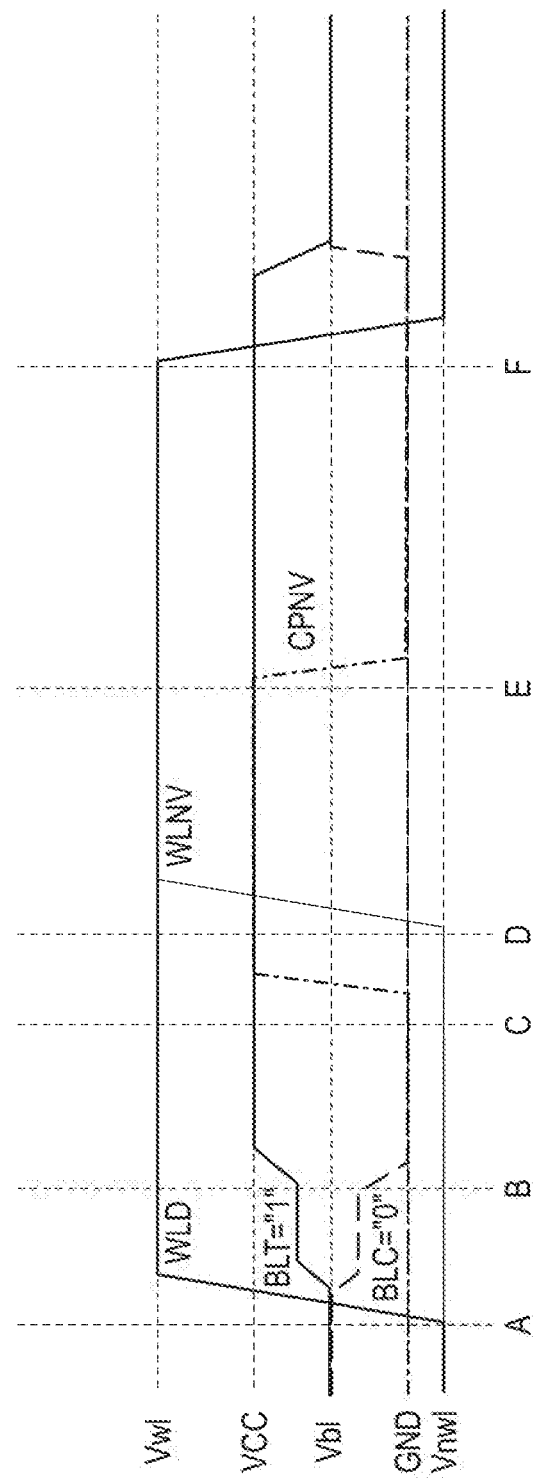
FIG. 7A and FIG. 7B are timing diagrams that illustrate a memory operation that copies data from a 2T2C DRAM memory cell to a 2T2C NVRAM memory cell in accordance with an embodiment of the present disclosure.

FIG. 7A is a timing diagram that illustrates a memory operation that copies data from a DRAM memory cell to an NVRAM memory cell in accordance with an embodiment of the present disclosure. By way of example and not limitation, FIG. 7A illustrates a memory operation that reads and writes a logical "1" value. The memory operation of FIG. 7A may occur in any of the various hybrid NVRAM/DRAM structures discussed herein, but is illustrated in FIG. 7A with specific reference to a 2T2C configuration.

Initially, the row decoder 20 does not apply a signal on either the WLD or the WLNV lines. Thus, both the WLD and WLNV signal lines are de-asserted with voltages at a low level. The C1 and C2 capacitors of the DRAM memory cell store charges that represent complementary logical values. With the WLD signal line de-asserted, the C1 and C2 capacitors are disconnected from the bit lines BLT and BLC such that the stored charges remain stored in the DRAM memory cell. In this state, the voltage of the bit lines BLT and BLC are at an intermediate voltage that may be established on the bit lines through a pre-charge operation. In the initial state, the CPNV signal line is de-asserted and thus at a low voltage.

At time point A, the row decoder 20 asserts the WLD signal line by driving this signal line to a high voltage. The asserted WLD signal line provides a high voltage to the gates, of the T1 and T2 transistors of the DRAM memory cell. This gate voltage turns on the T1 and T2 transistors thus coupling the C1 and C2 capacitors to the bit lines BLT and BLC. Here, the charges stored in the C1 and C2 capacitors are transferred out of the DRAM memory cell and onto the bit lines BLT and BLC. In the example of FIG. 7A, the DRAM memory cell, stores a logical "1". Thus, when the C1 and C2 capacitors are coupled to the bit lines BLT and BLC through the T1 and T2 transistors, the BLT voltage rises by a small amount and the BLC voltage falls by a small amount.

At time point B, the sense amplifier 25 is triggered by the difference between the voltages on the bit lines BLT and BLC. Through the operation of the sense amplifier 25, the small voltage difference between the bit lines BLT and BLC is amplified. Here, the voltage on the bit line BLT, which at first rose by a small amount, is driven by the sense amplifier 25 to a high voltage. In the example of FIG. 7A, the sense amplifier 25 drives the BLT signal line to VCC. Additionally, the voltage on the bit line BLC, which at first fell by a small amount, is driven by the sense amplifier 25 to a low voltage. In the example of FIG. 7A, the sense amplifier 25 drives the BLC signal line to ground. The sense amplifier 25 driving the bit lines BLT and BLC to a high, and low voltage respectively restores the logical value read from the DRAM cell back to the DRAM cell.

The sense amplifier 25 driving the bit lines BLT and BLC may also provide the logical value read from the DRAM memory cell to another location. In the example of FIG. 7A, the logical value read from the DRAM memory cell is provided to a corresponding NVRAM memory cell. Thus, at time point C, the CPNV signal line is driven to a high voltage in preparation for the logic value present on the bit lines BLT and BLC lines to be stored in a corresponding NVRAM memory cell. In the example of FIG. 7A, the CPNV signal is driven to VCC. With the CPNV signal line driven to a high voltage, a high voltage is provided to C1 and C2 capacitors of the NVRAM memory cell. More specifically, the high voltage is provided to the first plate 114 of the C1 capacitor and to the first plate 120 of the C2 capacitor.

At time point D, the row decoder 20 asserts the WLNV signal line by driving this signal line to a high voltage. The asserted WLNV signal line provides a high voltage to the gates of the T1 and T2 transistors of the NVRAM memory cell. This gate voltage turns on, the T1 and T2 transistors thus coupling the C1 and C2 capacitors to the bit lines BLT and BLC. Here, the BLT signal line remains at a high voltage and the BLC signal remains at a low voltage via the operation of the sense amplifier 25. With the voltage of the CPNV line at a high level, a voltage differential exists between the CPNV line and the bit line BLC. Through this voltage differential and through the operation of the 12 transistor, the polarization of the ferroelectric material 124 between the first and second plates 120 and 122 is driven to a low level. In this way, the logical "0" value represented by the low voltage on the bit line BLC is stored in the C2 capacitor of the NVRAM memory cell. With the voltage of the CPNV line at a high level, no voltage differential exits between the CPNV line and the bit line BLT. Thus, no charge is transferred from the bit line BLT to the C1 capacitor at this time. Rather, the current logical state of the C1 capacitor remains stored until the CPNV line toggles.

At time point E, the CPNV signal line is driven to a low voltage. In the example of FIG. 7A, the CPNV signal is driven to ground. Additionally, the row decoder 20 continues to assert the WLNV signal line by driving this signal line to a high voltage. With the CPNV signal, line driven low and the WLNV signal driven high, the low voltage of the CPNV signal is provided to the C1 and C2 capacitors of the NVRAM memory cell. More specifically, the low voltage is provided to the first plate 114 of the C1 capacitor and to the first plate 120 of the C2 capacitor. The asserted WLNV signal line continues to provide a high voltage to the gates of the T1 and T2 transistors of the NVRAM memory cell. As mentioned, this gate voltage turns on the T1 and T2 transistors thus coupling the C1 and C2 capacitors to the bit lines BLT and BLC. The BLT signal line remains at a high voltage and the BLC signal remains at a low voltage via the operation of the sense amplifier 25. With the voltage of the CPNV line at a low level, a voltage differential exists between the CPNV line and the bit line BLT. Through this voltage differential and through the operation of the T1 transistor, the polarization of the ferroelectric material 118 between the first and second plates 114 and 116 is driven to a high level. With the voltage of the CPNV line at a low level, no voltage differential exits between the CPNV line and the bit line BLC. Here, the logic state previously transferred to the C2 capacitor remains stored.

At time point F, the row decoder de-asserts the WLD and WLNV signals by driving these signals to a low voltage. The de-asserted WLD signal line provides a low voltage to the gates of the T1 and T2 transistors of the DRAM memory cell. This gate voltage turns off the T1 and T2 transistors thus decoupling the C1 and C2 capacitors of the DRAM cell from the bit lines BLT and BLC. Here, the charges restored to the C1 and C2 capacitors of the DRAM memory cell through the operation of the sense amplifier 25 remain stored in the DRAM memory cell. The de-asserted WLNV signal line provides a low voltage to the gates of the T1 and T2 transistors of the NVRAM memory cell. This gate voltage turns off the T1 and T2 transistors thus decoupling the C1 and C2 capacitors of the NVRAM call from the bit lines BLT and BLC. Here, the charges stored to the C1 and C2 capacitors to the NVRAM memory cell through the operation of the sense amplifier 25 remain stored in the NVRAM memory cell. With the bit lines BLT and BLC de-coupled from the DRAM and NVRAM cells, these signal lines return to their initial states. In the event that the next, memory operation is a DRAM access, the bit lines BLT and BLC may be pre-charged to an intermediate voltage.

Figure 7B:
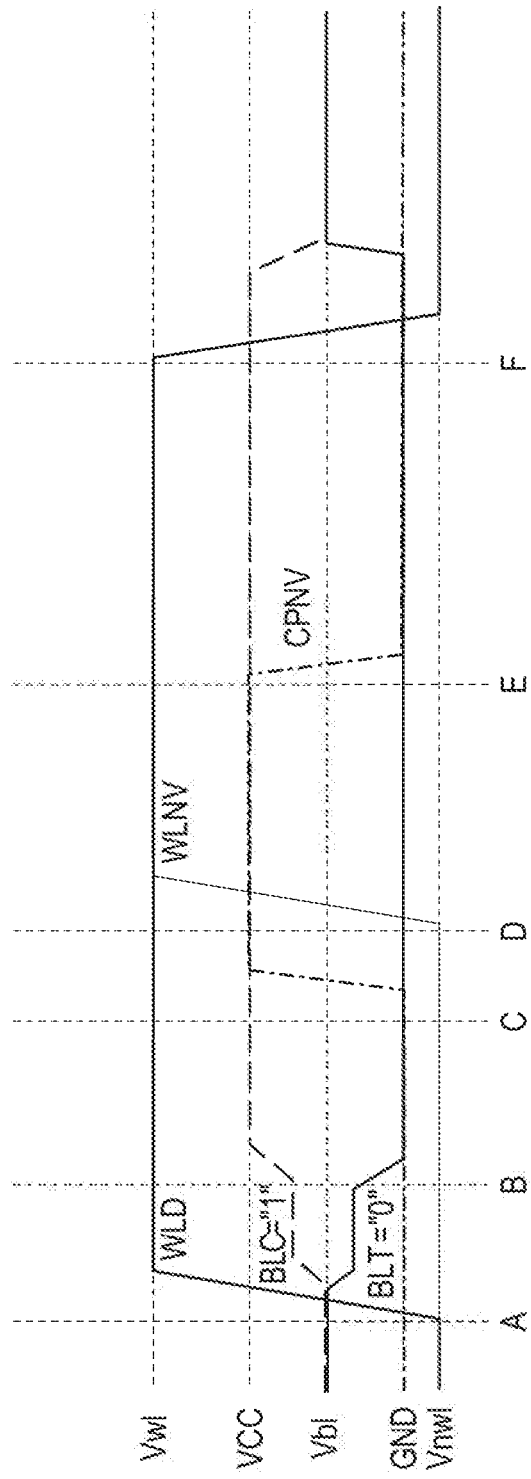

FIG. 7B is a timing diagram that illustrates a memory operation that copies data from a DRAM memory cell to an NVRAM memory cell in accordance with an embodiment of the present disclosure. The memory operation of FIG. 7B may occur in any of the various hybrid NVRAM/DRAM structures discussed herein, but is illustrated in FIG. 7B with specific reference to a 212C configuration. The memory operation of FIG. 7B is similar to the memory operation of FIG. 7A; however, in FIG. 7B the memory operation reads and writes a logical "0" value. Thus, initially, the row decoder does not apply a signal on either the WLD or the WLD lines and the state of the circuit is as described above in connection with FIG. 7A. At time point A, the row decoder 20 provides a high voltage to the WLD so as to transfer the charges stored in the C1 and C2 capacitors onto the bit lines BLT and BLC. Here, the BLC voltage rises by a small amount and the BLT voltage falls by a small amount due to DRAM memory cell storing a logical "0". At time point B, the sense amplifier 25 is triggered and the voltage on the bit line BLC is driven to a high voltage and the voltage on the bit line BLT is driven to a low voltage thus restoring the logical value read from the DRAM cell back to the DRAM cell. At time point C, the CPNV signal line is driven to a high voltage in preparation for the logic value present on the bit lines BLT and BLC lines to be stored in a corresponding NVRAM memory cell. At time point D, the row decoder 20 drives the WLNV signal line to a high voltage to store the logical "0" value represented by the low voltage on the bit line BLT is stored in the C1 capacitor of the NVRAM memory cell. At time point E, the CPNV signal line is driven to a low voltage so as to store the logical "1" value represented by the high voltage on the bit line BLC in the C2 capacitor of the NVRAM memory cell. At time point F, the row decoder de-asserts the WLD and WLNV so as to decouple the bit lines BLT and BLC from the DRAM and NVRAM memory cells as described above in connection with FIG. 7A.

Figure 8A:
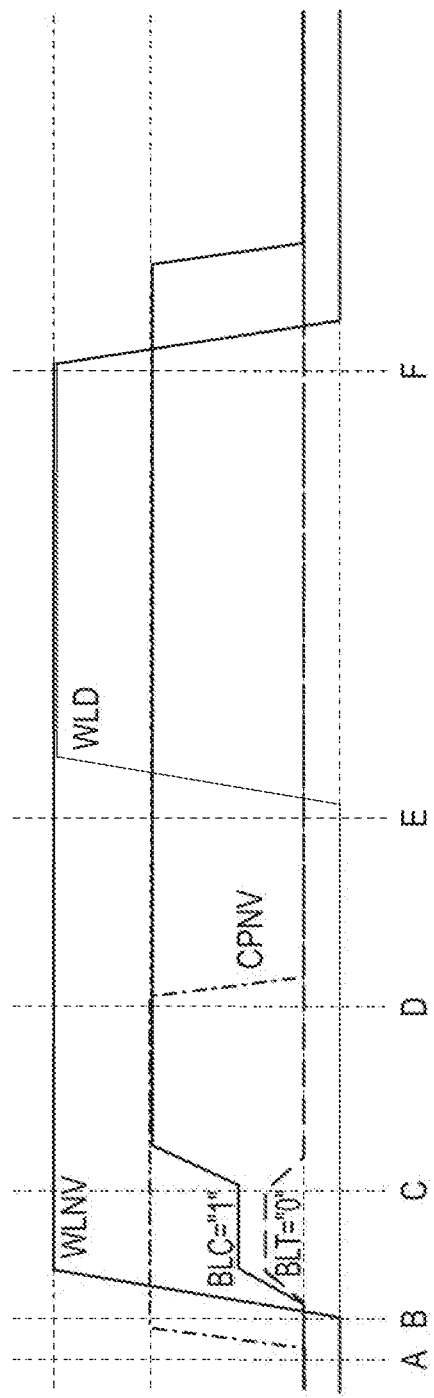
FIG. 8A and FIG. 8B are a timing diagrams that illustrate a memory operation that copies data from an 2T2C NVRAM memory cell to a 2T2C DRAM memory cell in accordance with an embodiment of the present disclosure.

FIG. 8A is a timing diagram that illustrates a memory operation that copies data from an NVRAM memory cell to a DRAM memory cell in accordance with an embodiment of the present disclosure. By way of example and not limitation, FIG. 8A illustrates a memory operation that reads and writes a logical "0" value. The memory operation of FIG. 8A may occur in any of the various hybrid NVRAM/DRAM structures discussed herein, but is illustrated in FIG. 8A with specific reference to a 2T2C configuration.

Initially, the row decoder 20 does not apply a signal on either the WLD or the WLNV lines. Thus, both the WLD and WLNV signal lines are de-asserted with voltages at a low level. The C1 and C2 capacitors of the DRAM memory cell store charges that represent complementary logical values. With the WLNV signal line de-asserted, the C1 and C2 capacitors of the NVRAM memory cell are disconnected from the bit lines BLT and BLC such that the charges stored by the C1 and C2 capacitors remain stored in the NVRAM memory cell. In the event of an NVRAM read operation, no pre-charging of the bit lines BLT and BLC occurs. Thus, these signals remain at a low voltage. In the initial state, the CPNV signal line is de-asserted and thus at a low voltage.

At time point A, the CPNV signal line is driven to a high voltage in preparation for the logic value stored in C1 and C2 capacitors to be read out of the NVRAM memory cell. In the example of FIG. 8A, the CPNV signal is driven to VCC. With the CPNV signal line driven to a high voltage, the high voltage is provided to the C1 and C2 capacitors of the NVRAM memory cell. More specifically, the high voltage is provided to the first plate 114 of the C1 capacitor and to the first plate 120 of the C2 capacitor.

At time point B, the row decoder 20 asserts the WLNV signal line by driving this signal line to a high voltage. The asserted WLNV signal line provides a high voltage to the gates of the T1 and T2 transistors of the NVRAM memory cell. This gate voltage turns on the T1 and T2 transistors thus coupling the C1 and C2 capacitors to the bit lines BLT and BLC. Here, the charges stored in the C1 and C2 capacitors are transferred out of the NVRAM memory cell and onto the bit fines BLT and BLC. In the example of FIG. 8A, the DRAM memory cell, stores a logical Thus, when the C1 and C2 capacitors are coupled to the bit lines BLT and BLC through the T1 and T2 transistors, the BLT voltage rises above ground by a small amount and the BLC voltage rises above ground by a larger amount as compared to the voltage rise on the BLT line.

At time point C, the sense amplifier 25 is triggered by the difference between the voltages on the bit lines BLT and BLC. Through the operation of the sense amplifier 25, the small voltage difference on the bit line BLT and BLC is amplified. Here, the voltage on the bit line BLC, which at first rose by a larger amount than that of the bit line BTL, is driven by the sense amplifier 25 to a high voltage. In the example of FIG. 8A, the sense amplifier 25 drives the BLC signal line to VCC. Additionally, the voltage on the bit line BLT, which at first fell by a small amount, is driven by the sense amplifier 25 to a low voltage. In the example of FIG. 8A, the sense amplifier 25 drives the BLT signal line to ground. Following time point C, the BLC signal line remains at a high voltage and the BLT signal remains at a low voltage through the operation of the sense amplifier 25.

The sense amplifier 25 driving the bit lines BLT and BLC to a high and low voltage respectively restores the logical value read from the NVRAM cell back to the NVRAM cell. With the voltage of the CPNV line at a high level, a voltage differential exists between the CPNV line and the bit line BLT. Through this voltage differential and the operation of the T1 transistor, the polarization of the ferroelectric material 118 between the first and second plates 114 and 116 is driven to a low level. In this way, the logical "0" value represented by the low voltage on the bit line BLT is restored to the C1 capacitor of the NVRAM memory cell. With the voltage of the CPNV line at a high level, no voltage differential exits between the CPNV line and the bit line BLC. Thus, no charge is restored to the C2 capacitor at this time.

At time point D, the CPNV signal line is driven to a low voltage. In the example of FIG. 8A, the CPNV signal is driven to ground. The row decoder 20 continues to assert the WLNV signal line by driving this signal line to a high voltage. With the CPNV signal line driven low and the WLNV signal driven high, the low voltage of the CPNV signal is provided to the C1 and C2 capacitors of the NVRAM memory cell. More specifically, the low voltage is provided to the first plate 114 of the C1 capacitor and to the first plate 120 of the C2 capacitor. The asserted WLNV signal line continues to provide a high voltage to the gates of the T1 and T2 transistors of the NVRAM memory cell. As mentioned, this gate voltage turns on the T1 and T2 transistors thus coupling the C1 and C2 capacitors to the bit lines BLT and BLC. The BLC signal line remains at a high voltage and the BLT signal remains at a low voltage through the operation of the sense amplifier 25. With the voltage of the CPNV line at a low level, a voltage differential exists between the CPNV line and the bit line BLC. Through this voltage differential and the operation of the 12 transistor, the polarization of the ferroelectric material 124 between the first and second plates 120 and 122 is driven to a high level. In this way, the logical value represented by the high voltage on the bit line BLC is restored in the C2 capacitor of the NVRAM memory cell. With the voltage of the CPNV line at a low level, no voltage differential exits between the CPNV line and the bit line BLT. Here, the logic state previously restored to the C1 capacitor remains stored.

The sense amplifier 25 driving the bit lines BLT and BLC also provides the logical value read from the NVRAM memory cell to another location. In the example of FIG. 8A, the logical value, read from the NVRAM memory cell is provided, to a corresponding DRAM memory cell. Thus, at time point D, the row decoder 20 asserts the WLD signal line by driving this signal line to a high voltage. The asserted WLD signal line provides a high voltage to the gates of the T1 and T2 transistors of the DRAM memory cell. This gate voltage turns on the T1 and T2 transistors of the DRAM memory cell thus coupling the C1 and C2 capacitors to the bit lines BLT and BLC.

At time point F, the row decoder de-asserts the WLD and WLNV signals by driving these signals to a low voltage. The de-asserted WLNV signal line provides a low voltage to the gates of the T1 and T2 transistors of the NVRAM memory cell. This gate voltage turns off the T1 and T2 transistors thus decoupling the C1 and C2 capacitors of the NVRAM cell from the bit lines BLT and BLC. Here, the charges restored to the C1 and C2 capacitors through the operation of the sense amplifier 25 remain stored in the NVRAM memory cell. The de-asserted WLD signal line provides a low voltage to the gates of the T1 and T2 transistors of the DRAM memory cell. This gate voltage turns off the T1 and 12 transistors thus decoupling the C1 and C2 capacitors of the DRAM cell from the bit lines BLT and BLC. Here, the charges stored to the C1 and C2 capacitors through the operation of the sense amplifier 25 remain stored in the DRAM memory cell. With the bit lines BLT and BLC de-coupled from the DRAM and NVRAM cells, these signal lines return to a low voltage.

Figure 8B:
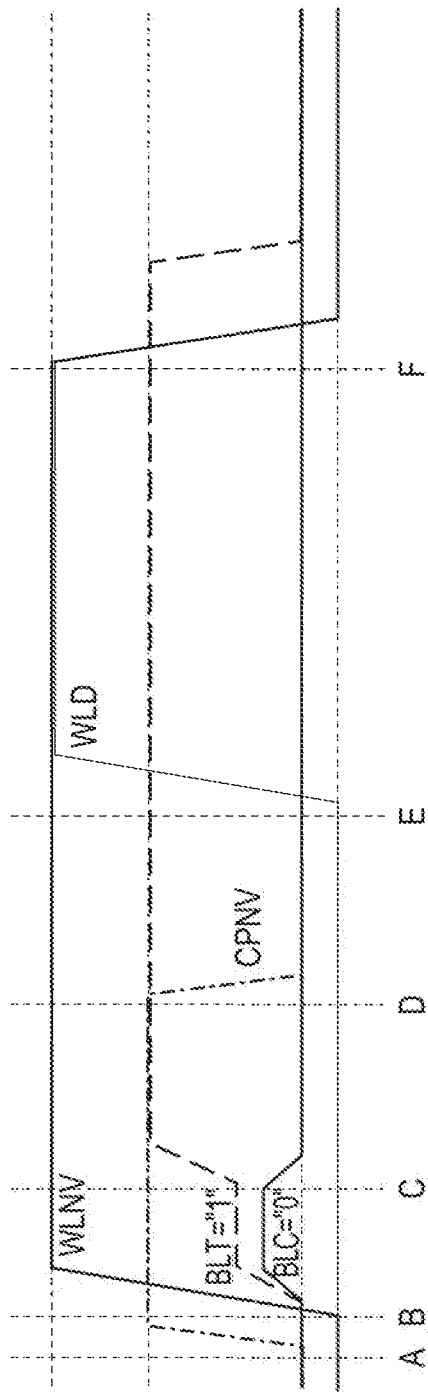

FIG. 8B is a timing diagram that illustrates a memory operation that copies data from an NVRAM memory cell to a DRAM memory cell in accordance with an embodiment of the present disclosure. The memory operation of FIG. 8B may occur in any of the various hybrid NVRAM/DRAM structures discussed herein, but is illustrated in FIG. 8B with specific reference to a 2T2C configuration. By way of example and not limitation, FIG. 8B illustrates a memory operation that reads and writes a logical "1" value. The memory operation of FIG. 8B is similar to the memory operation of FIG. 8A; however, in FIG. 8B the memory operation reads and writes a logical "1" value. Thus, initially, the row decoder does not apply a signal on either the WLD or the WLD lines and the state of the circuit is as described above in connection with FIG. 8A. At time, point A, the CPNV signal line is driven to a high voltage in preparation for the logic value stored in the C1 and C2 capacitors to be read out of the NVRAM memory cell. At time point B, the row decoder 20 provides a high voltage to the WLNV so as to transfer the charges stored in the C1 and C2 capacitors onto the bit lines BLT and BLC. Here, the BLC voltage rises above ground by a small amount and the BLT voltage rises above ground by a larger amount as compared to the voltage rise, on the BLC line. At time point C, the sense amplifier 25 is triggered and the voltage on the bit line BLC is driven to a high voltage and the voltage on the bit line BLT is driven to a low voltage. With the CPNV line at a high voltage, the logical "0" represented by the low voltage on the BLC line is restored to the C2 capacitor of the NVRAM memory cell. At time point D, the CPNV signal line is driven to a low voltage and the logical "1" represented by the high voltage on the BLT line is restored to the C1 capacitor of the NVRAM memory cell. At time point E, the row decoder 20 drives the WLD to a high voltage so as to store the logical value read from the NVRAM cell in the DRAM cell.

Figure 9A:
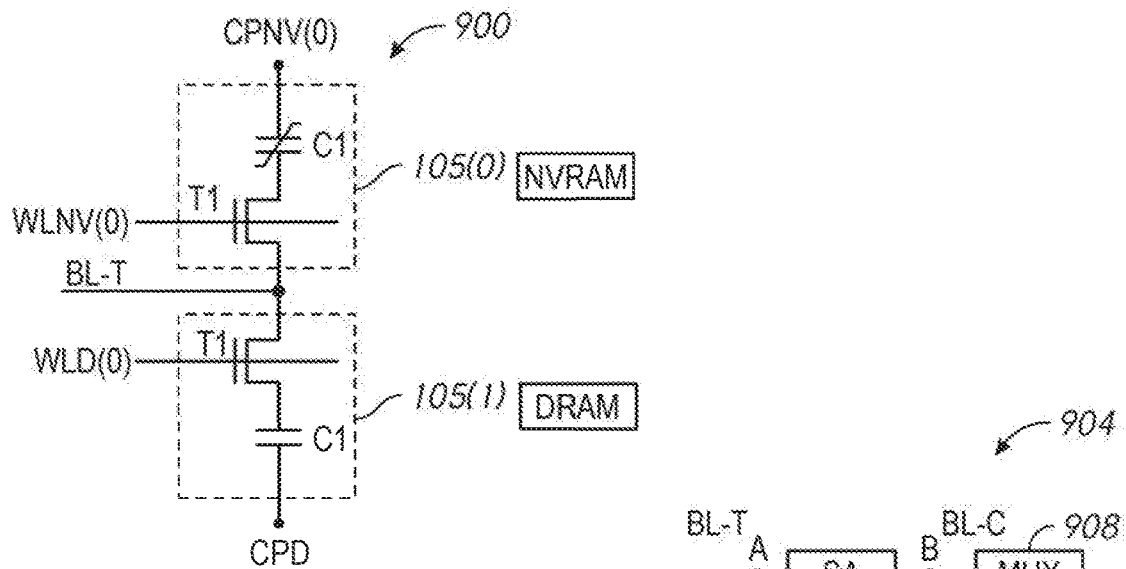
FIG. 9A is a schematic diagram of example memory cells including one transistor and one capacitor according to an embodiment of the disclosure.

FIG. 9A is a schematic diagram of an example circuit 900 that includes two memory cells 105(0) and 105(1) according to an embodiment of the disclosure. A dashed line demarcates an approximate boundary of the memory cell 105. Each of the memory cells 105 includes one selection components T1 and one capacitor C1. The capacitor C1 of the first memory cell 105(0) may be a ferroelectric capacitor. The capacitor C1 of the second memory cell 105(1) may be a dielectric capacitors. The selection components T1 of the two memory cells 105(0) and 105(1) may be transistors, for example, n-type field effect transistors. In such an example, each of the memory cells 105 includes one transistor and one capacitor (e.g., 1T1C).

Operation of the selection components T1 is controlled by applying voltages to the transistor gates. A respective word line may activate the selection components. WLNV(0) may activate the selection component T1 of memory cell 105(0). WLD(0) may activate the selection component T1 of memory cell 105(1). The capacitor C1 has a first plate and a second plate. In the first memory cell 105(0), the first plate of capacitor C1 is coupled to the plate line CPNV(0). In the second memory cell 105(1), the first plate of capacitor C1 is coupled to the plate fine CPD. In the first and second memory cells 105(0) and 105(1), the second plate of the capacitor C1 is coupled to the selection component T1. The selection component T1 is further coupled to a digit line BLT. The digit line BLC is driven by a reference voltage.

When activated, such as by respective word lines (e.g. WLNV(0) for the memory cell 105(0), and WLD(0) for the memory cell 105(1)), the second plate of the capacitor C1 is coupled to the digit lines BLT. As previously discussed, when coupled to the digit line BLT, the memory cells 105 may be accessed. For example, a stored state of the memory cells 105 may be read and/or the memory cells 105 may be written to store a new state or the same state. Various voltages may be applied to the plate of the capacitor C1 over the digit lines BLT and the plate line CP to access (e.g., read and/or write) the memory cells 105. In some embodiments, the plate line CPD is tied to a constant voltage, while the plate line CPNV is coupled to a voltage driver that drives the plate lines CPNV with different voltages. The plate line CPNV may be driven with different voltages during different phases of an NVRAM write operation.

Figure 9B:
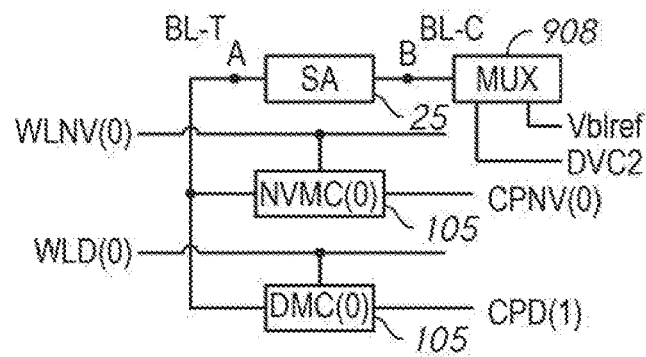
FIG. 9B is a schematic diagram of an example circuit that includes two memory cells coupled to a sense amplifier.

FIG. 9B is a schematic diagram an example circuit 904 that includes the two memory cells 105(0) and 105(1), along with the coupling of these cell to a sense amplifier 25. In the 1T1C configuration, the memory cells 105(0) and 105(1) are coupled to the sense amplifier though the bit line BLT. The bit line BLC is coupled to a reference voltage. In some embodiments, the bit line BLC is coupled to the sense amplifier through a multiplexer 908 or other switching device that enables coupling of different reference voltages to the bit line BLC. Here, the multiplexer 908 may provide a first reference voltage for DRAM access and a second reference voltage for NVRAM access.

Figure 9C:
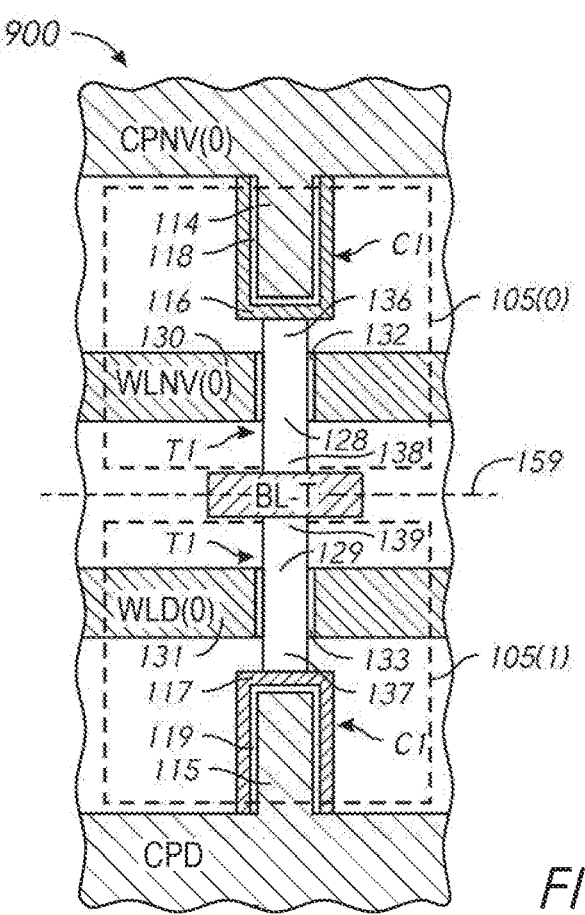
FIG. 9C is a diagrammatic cross-sectional side view of a region of an example memory array showing example memory cells including one transistor and one capacitor according to an embodiment of the disclosure.

FIG. 9C shows a portion of a memory array 10 including the example circuit 900 of FIG. 9A according to an embodiment of the disclosure. In the embodiment of FIG. 9C, the memory cell 105(0) is vertically stacked over the memory cell 105(1). A dashed line demarcates an approximate boundary of the memory cells 105(0) and 105(1). In some embodiments the memory cells 105 of FIG. 9A may be considered to comprise memory cells within an 4F2 architecture, where F indicates a minimum features size of a given technology.

The illustrated portion of memory array 10 is supported by a base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base may correspond to a semiconductor substrate containing one or more materials associated with integrated circuit fabrication. Such materials may include, for example, one or more of refractory metal materials, barrier materials, diffusion materials, insulator materials, etc.

The memory cells 105(0) and 105(1) are in a common column as one another within the memory array. The digit line BLT is between the memory cells 105(0) and 105(1) and extends in and out of the page relative to the cross-section of FIG. 9C. The digit line BLT may be coupled with a sense component 25 of the type previously described with reference to FIGS. 1, 2A and 2B. The digit line BLT is shared by the memory cells 105(0) and 105(1).

The memory cell 105(0) comprises a first transistor T1. The memory cell 105(0) comprises the first capacitor C1 above the first transistor T1. The first transistor T1 is vertically displaced relative to the first capacitor C1. The first capacitor C1 comprises a first plate 114, a second plate 116, and ferroelectric material 118 between the first and second plates 114 and 116. In the shown embodiment the second plate 116 is a container-shaped outer plate, and the first plate 114 is an inner plates which extends into the container-shaped outer plate. In other embodiments the second plate 116 may have other configurations, and the first plate 114 may also have other configurations.

The first plate 114 is coupled with a plate line structure CPNV(0) provided above the first capacitor C1 of the memory cell 105(0). In the illustrated embodiment, the first plate 114 share a common composition with the plate line structure CPNV(0). In other embodiments, the plate line structure CPNV(0) may comprise a different composition as compared to the first plate 114.

The first transistor T1 is between the first capacitor C1 and the digit line BLT. In the shown embodiment, the word line WLNV(0) extends along a horizontal plane and comprises the gate 130 of the first transistors T1. A first semiconductor pillar 128 extends upwardly from the digit line BLT to the second plate 116 of the first capacitor C1 and the first transistor T1 is along such first semiconductor pillar.

The first transistor T1 includes the gate dielectric material 132, and further includes the first channel region within the semiconductor pillar 128 and along the gate dielectric material 132, and source/drain regions 136 and 138 within the semiconductor pillar and on opposing sides of the channel region. The source/drain region 136 is coupled with the second plate 118 of first capacitor C1, and the source/drain region 138 is coupled with the digit line BLT.

The memory cell 105(1) comprises the first capacitor C1 below the first transistor T1. The first transistor T1 is vertically displaced relative to the first capacitor C1. The first capacitor C1 comprises a first plate 115, a second plate 117, and dielectric material 119 between the first and second plates 115 and 117.

In the shown embodiment, the second plate 117 is a container-shaped outer plate, and the first plate 115 is an inner plate which extend into the container-shaped outer plate. In other embodiments, the second plate 117 may have other configurations, and the first plate 115 may also have other configurations, in one example, the first plates 115 and 121 (coupled to the plate line CPD) may be container-shaped and the second plates 117 coupled to the pillar 129 including the source/drain region 137) and 123 (coupled to the pillar 141 including the source/drain region 149) may be inner plates, which extend into the container-shaped outer plates.

The first plate 115 is coupled with a plate line structure CPD provided below the first capacitor C1 of the memory cell 105(1). In the illustrated embodiment the first plate 115 share a common composition with the plate line structure CPD. In other embodiments, the plate line structure CP may comprise a different composition as compared to the first plate 115.

The first transistor T1 is between the first capacitor C1 and the digit line BLT. In the shown embodiment, the word line WLD(0) extends along a horizontal plane and comprises the gate 131 of the first transistors T1. A first semiconductor pillar 129 extends downwardly from the digit line BLT to the second plate 117 of the first capacitor C1, and the first transistor T1 is along such first semiconductor pillar.

The first transistor T1 includes the gate dielectric material 133, and further includes the first channel region within the semiconductor pillar 129 and along the gate dielectric material 133, and source/drain regions 137 and 139 within the semiconductor pillar and on opposing sides of the channel region. The source/drain region 137 is coupled with the second plate 117 of first capacitor C1, and the source/drain region 139 is coupled with the digit line BLT.

In the illustrated embodiment, an axis 159 extends through the digit line BLT and may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement.

Figure 10A:
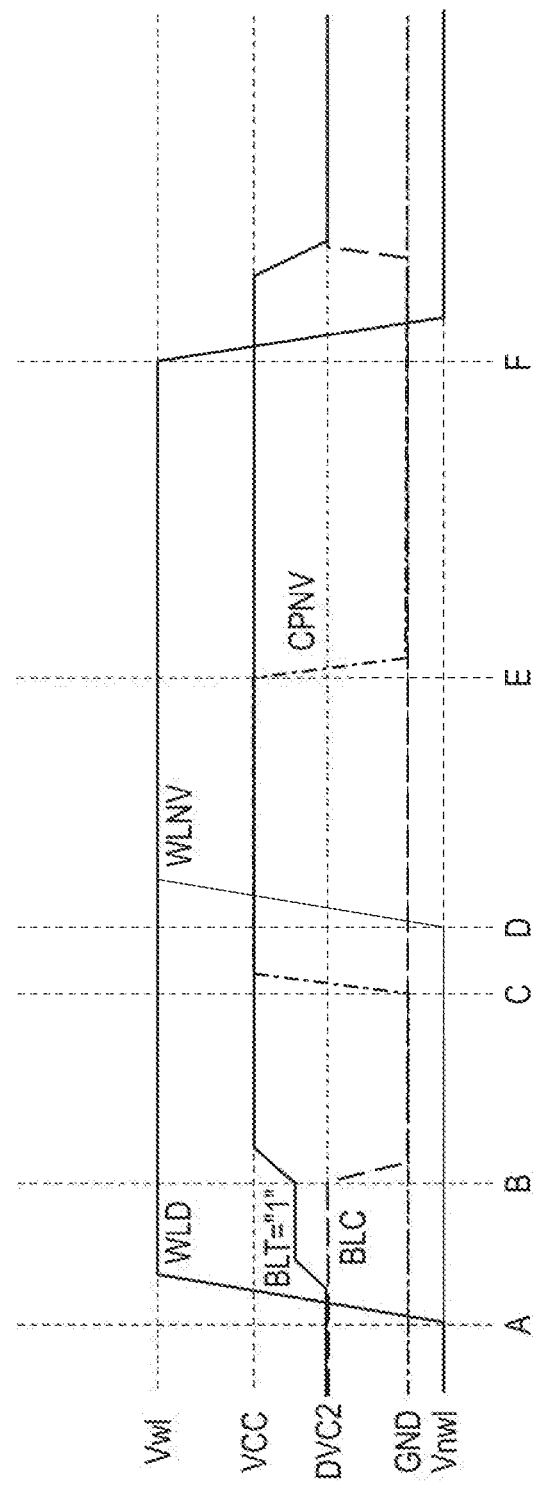
FIG. 10A and FIG. 10B are timing diagrams that illustrate a memory operation that copies data from a 1T1C DRAM memory cell to an 1T1C NVRAM memory cell in accordance with an embodiment of the present disclosure.

FIG. 10A is a timing diagram that illustrates a memory operation that copies data from a DRAM memory cell to an NVRAM memory cell in accordance with an embodiment of the present disclosure. By way of example and not limitation, FIG. 10A illustrates a memory operation that reads and writes a logical "1" value. The memory operation of FIG. 10A may occur in any of the various hybrid NVRAM/DRAM structures discussed herein, but is illustrated in FIG. 10A with specific reference to a 1T1C configuration.

Initially, the row decoder 20 does not apply a signal on either the WLD or the WLNV lines. Thus, both the WLD and WLNV signal lines are de-asserted with voltages at a low level. The C1 capacitor of the DRAM memory cell stores a charge that represents a logical value. With the WLD signal line de-asserted, the C1 capacitor is disconnected from the bit line BLT such that the stored charge remains stored in the DRAM memory cell. In this state, the voltage of the bit lines BLT and BLC are at an intermediate voltage that may be established on the bit lines through a pre-charge operation. In the initial state, the CPNV signal line is de-asserted and thus at a low voltage.

At time point A, the row decoder 20 asserts the WLD signal line by driving this signal line to a high voltage. The asserted WLD signal line provides a high voltage to the gate of the T1 transistor of the DRAM memory cell. This gate voltage turns on the T1 transistor thus coupling the C1 capacitor to the bit line BLT. Here, the charge stored in the C1 capacitor is transferred out of the DRAM memory cell and onto the bit lines BLT. In the example of FIG. 10A, the DRAM memory cell stores a logical "1". Thus, when the C1 capacitor is coupled to the bit line BLT through the T1 transistor, the BLT voltage rises by a small amount and the BLC voltage remains at a reference voltage.

At time point B, the sense amplifier 25 is triggered by the difference between the voltages on the bit lines BLT and BLC. Through the operation of the sense amplifier 25, the small voltage difference between the bit lines BLT and BLC is amplified. Here, the voltage on the bit line BLT, which at first rose by a small amount, is driven by the sense amplifier 25 to a high voltage. In the example of FIG. 10A, the sense amplifier 25 drives the BLT signal line to VCC. Additionally, the voltage on the bit line BLC, which remained at a reference voltage, is driven by the sense amplifier 25 to a low voltage. In the example of FIG. 10A, the sense amplifier 25 drives the BLC signal line to ground. The sense amplifier 25 driving the bit lines BLT and BLC to a high and low voltage respectively restores the logical value read from the DRAM cell back to the DRAM cell.

The sense amplifier 25 driving the bit lines BLT and BLC may also provide the logical value read from the DRAM memory cell to another location, in the example of FIG. 10A, the logical value read from the DRAM memory cell is provided to a corresponding NVRAM memory cell. Thus, at time point C, the CPNV signal line is driven to a high voltage in preparation for the logic value present on the bit line BLT to be stored in a corresponding NVRAM memory cell. In the example of FIG. 10A, the CPNV signal is driven to VCC. With the CPNV signal line driven to a high voltage, a high voltage is provided to the C1 capacitor of the NVRAM memory cell. More specifically, the high voltage is provided to the first plate 114 of the C1 capacitor.

At time point D, the row decoder 20 asserts the WLNV signal line by driving this signal line to a high voltage. The asserted WLNV signal line provides a high voltage to the gate of the T1 transistor of the NVRAM memory cell. This gate voltage turns on the T1 transistor thus coupling the C1 capacitor to the bit line BLT. Here, the BLT signal line remains at a high voltage and the BLC signal remains at a low voltage via the operation of the sense amplifier 25. With the voltage of the CPNV line at a high level, no voltage differential exits between the CPNV line and the bit line BLT. Thus, no charge is transferred from the bit line BLT to the C1 capacitor at this time. Rather, the current logical state of the C1 capacitor remains stored until the CPNV line toggles.

At time point E, the CPNV signal line is driven to a low voltage. In the example of FIG. 10A, the CPNV signal is driven to ground. Additionally, the row decoder 20 continues to assert the WLNV signal line by driving this signal line to a high voltage. With the CPNV signal line driven low and the WLNV signal driven high, the low voltage of the CPNV signal is provided to the C1 capacitor of the NVRAM memory cell. More specifically, the low voltage is provided to the first plate 114 of the C1 capacitor. The asserted WLNV signal line continues to provide a high voltage to the gates of the T1 transistor of the NVRAM memory cell. As mentioned, this gate voltage turns on the T1 transistor thus coupling the C1 capacitor to the bit line BLT. The BLT signal line remains at a high voltage and the BLC signal remains at a low voltage via the operation of the sense amplifier 25. With the voltage of the CPNV line at a low level, a voltage differential exists between the CPNV line and the bit line BLT. Through this voltage differential and through the operation of the T1 transistor, the polarization of the ferroelectric material 118 between the first and second plates 114 and 116 is driven to a high level.

At time point F, the row decoder de-asserts the WLD and WLNV signals by driving these signals to a low voltage. The de-asserted WLD signal line provides a low voltage to the gates of the T1 transistor of the DRAM memory cell. This gate voltage turns off the T1 transistor thus decoupling the C1 capacitor of the DRAM cell from the bit line BLT. Here, the charge restored to the C1 capacitor of the DRAM memory cell, through the operation of the sense amplifier 25 remains stored in the DRAM memory cell. The de-asserted WLNV signal line provides a low voltage to the gate of the T1 transistor of the NVRAM memory cell. This gate voltage turns off the T1 transistor thus decoupling the C1 capacitor of the NVRAM cell from the bit line BLT. Here, the charge stored to the C1 capacitor to the NVRAM memory cell through the operation of the sense amplifier 25 remains stored in the NVRAM memory cell. With the bit line BLT de-coupled from the DRAM and NVRAM cells, these signal lines return to their initial states. In the event that the next memory operation is, a DRAM access, the bit lines BLT and BLC may be pre-charged to an intermediate voltage.

Figure 10B:
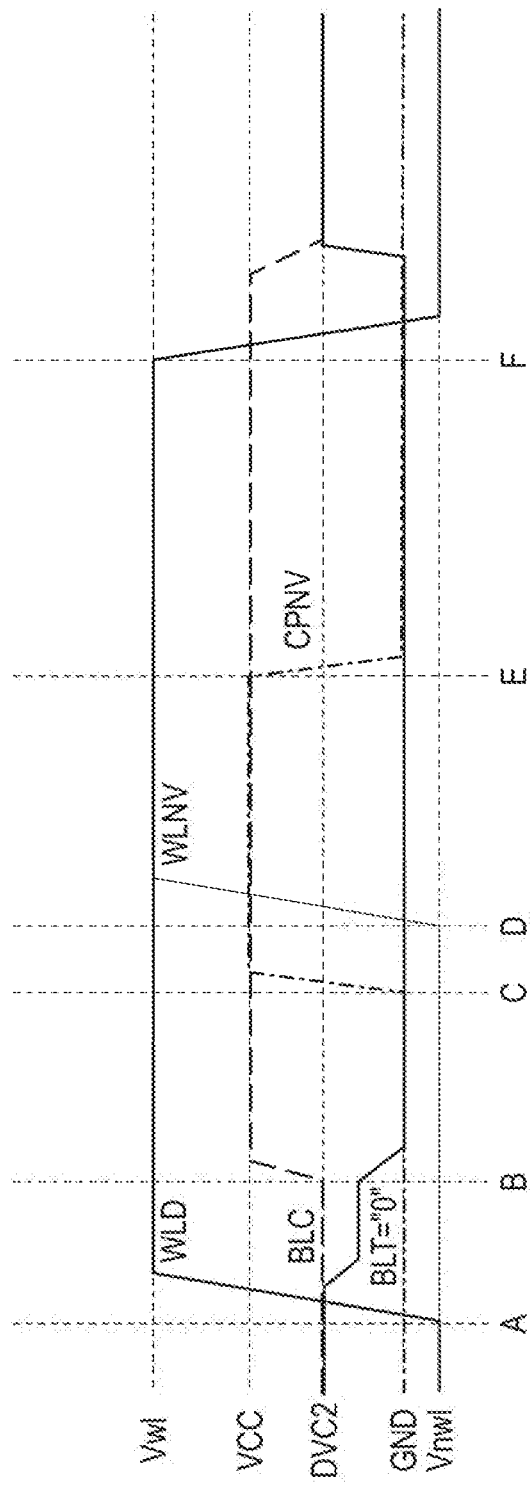

FIG. 10B is a timing diagram that illustrates a memory operation that copies data from a DRAM memory cell to an NVRAM memory cell in accordance with an embodiment of the present disclosure. The memory operation of FIG. 10B may occur in any of the various hybrid NVRAM/DRAM structures discussed herein, but is illustrated in FIG. 10B with specific reference to a 1T1C configuration. The memory operation of FIG. 10B is similar to the memory operation of FIG. 10A; however, in FIG. 10B the memory operation reads and writes a logical "0" value. Thus, initially, the row decoder does not apply a signal on either the WLD or the WLD lines and the state of the circuit is as described above in connection with FIG. 10A. At time point A, the row decoder 20 provides a high voltage to the WLD so as to transfer the charges stored in the C1 capacitor onto the bit line BLT. Here, the BLC voltage remains at a reference voltage and the BLT voltage falls by a small amount due to DRAM memory cell storing a logical "0". At time point B, the sense amplifier 25 is triggered and the voltage on the bit line BLC is driven to a high voltage and the voltage on the bit line BLT is driven to a low voltage thus restoring the logical value read from the DRAM cell back to the DRAM cell. At time point C, the CPNV signal line is driven to a high voltage in preparation for the logic value present on the bit line BLT line to be stored in a corresponding NVRAM memory cell. At time point D, the row decoder 20 drives the WLNV signal line to a high voltage to store the logical "0" value represented by the low voltage on the bit line BLT is stored in the C1 capacitor of the NVRAM memory cell. At time point E, the CPNV signal line is driven to a low voltage. At time point F, the row decoder de-asserts the WLD and WLNV so as to decouple the bit line BLT from the DRAM and NVRAM memory cells as described above in connection with FIG. 10A.

Figure 11A:
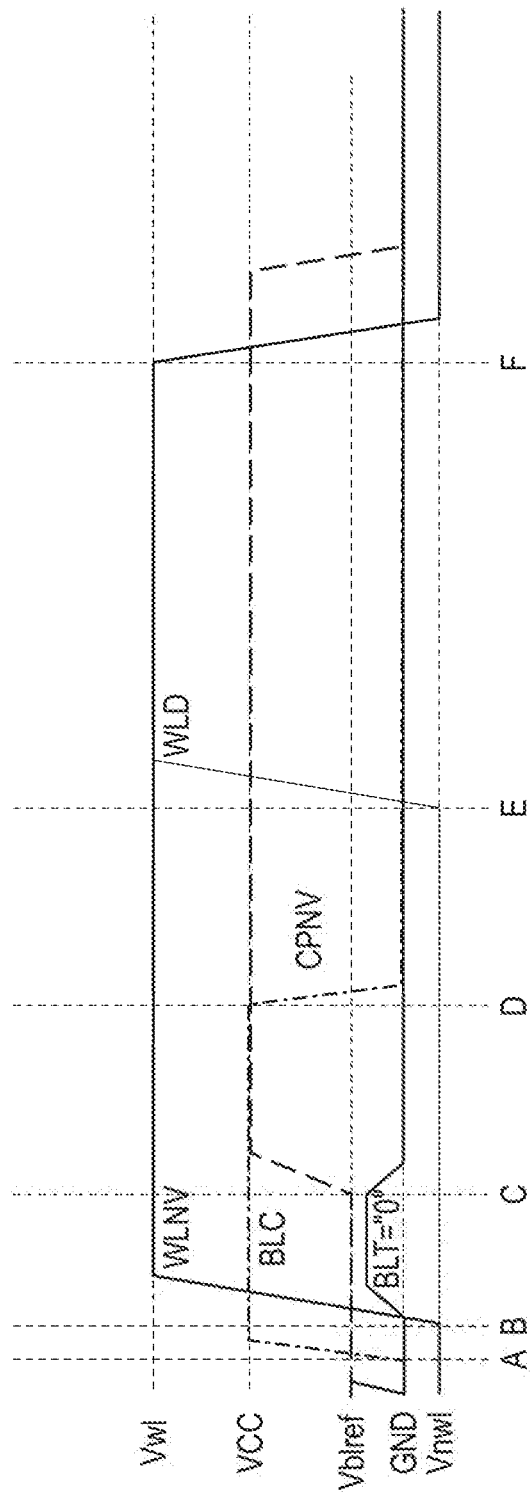
FIG. 11A and FIG. 11B are timing diagrams that illustrate a memory operation that copies data from an 1T1C NVRAM memory cell to a 1T1C DRAM memory cell in accordance with an embodiment of the present disclosure.

FIG. 11A is a timing diagram that illustrates a memory operation that copies data from an NVRAM memory cell to a DRAM memory cell in accordance with an embodiment of the present disclosure. By way of example and not limitation, FIG. 11A illustrates a memory operation that reads and writes a logical "0" value. The memory operation of FIG. 11A may occur in any of the various hybrid NVRAM/DRAM structures discussed herein, but is illustrated in FIG. 11A with specific reference to a 1T1C configuration.

Initially, the row decoder 20 does not apply a signal on either the WLD or the WLNV lines. Thus, both the WLD and WLNV signal lines are de-asserted with voltages at a low level. The C1 capacitor of the DRAM memory cell stores a charge that represents a logical value. With the WLNV signal line de-asserted, the C1 capacitor of the NVRAM memory cell is disconnected from the bit line BLT such that the charge stored by the C1 capacitor remains stored in the NVRAM memory cell. In the event of an NVRAM read operation, no pre-charging of the bit lines BLT and BLC occurs. Thus, these signals remain at a low voltage. In the initial state, the CPNV signal line is de-asserted and thus at a low voltage.

At time point A, the CPNV signal line is driven to a high voltage in preparation for the logic value stored in the C1 capacitor to be read out of the NVRAM memory cell. In the example of FIG. 11A, the CPNV signal is driven to VCC. With the CPNV signal line driven to a high voltage, the high voltage is provided to the C1 capacitor of the NVRAM memory cell. More specifically, the high voltage is provided to the first plate 114 of the C1 capacitor.

At time point B, the row decoder 20 asserts the WLNV signal line by driving this signal line to a high voltage. The asserted WLNV signal line provides a high voltage to the gate of the T1 transistor of the NVRAM memory cell. This gate voltage turns on the T1 transistor thus coupling the C1 capacitor to the bit line BLT. Here, the charge stored in the C1 capacitor is transferred out of the NVRAM memory cell and onto the bit line BLT. In the example of FIG. 11A, the DRAM memory cell stores a logical "0". Thus, when the C1 capacitor is coupled to the bit line BLT through the T1 transistor, the BLT voltage rises above ground by a small amount and the BLC voltage rises to a reference voltage that is greater than the voltage rise on the BLT line.

At time point C, the sense amplifier 25 is triggered by the difference between the voltages on the bit lines BLT and BLC. Through the operation of the sense amplifier 25, the small voltage difference on the bit lines BLT and BLC is amplified. Here, the voltage on the bit line BLC, which at first rose by a larger amount than that of the bit BTL, is driven by the sense amplifier 25 to a high voltage. In the example of FIG. 11A, the sense, amplifier 25 drives the BLC signal line to VCC. Additionally, the voltage on the bit line BLT, which at first rose by a small amount, is driven by the sense amplifier 25 to a low voltage. In the example of FIG. 11A, the sense amplifier 25 drives the BLT signal line to ground. Following time point C, the BLC signal line remains at a high voltage and the BLT signal remains at a low voltage through the operation of the sense amplifier 25.

The sense amplifier 25 driving the bit lines BLT and BLC to a high and low voltage respectively restores the logical value read from the NVRAM cell back to the NVRAM cell. With the voltage of the CPNV line at a high level, a voltage differential exists between the CPNV line and the bit line BLT. Through this voltage differential and the operation of the T1 transistor, the polarization of the ferroelectric material 116 between the first and second plates 114 and 116 is driven to a low level. In this way, the logical "0" value represented by the low voltage on the bit line BLT is restored to the C1 capacitor of the NVRAM memory cell.

At time point D, the CPNV signal line is driven to a low voltage. In the example of FIG. 11A, the CPNV signal is driven to ground. The row decoder 20 continues to assert the WLNV signal line by driving this signal line to a high voltage. With the CPNV signal line driven low and the WLNV signal driven high, the low voltage of the CPNV signal is provided to the C1 capacitor of the NVRAM memory cell. More specifically, the low voltage is provided to the first plate 114 of the C1 capacitor. The asserted WLNV signal line continues to provide a high voltage to the gate of the T1 transistor of the NVRAM memory cell. As mentioned, this gate voltage turns on the T1 transistor thus coupling the C1 capacitor to the bit line BLT. The BLC signal line remains at a high voltage and the BLT signal remains at a low voltage through the operation of the sense amplifier 25. With the voltage of the CPNV line at a low level, no voltage differential exits between the CPNV line and the bit line BLT. Here, the logic state previously restored to the C1 capacitor remains stored.

The sense amplifier 25 driving the bit lines BLT and BLC also provides the logical value read from the NVRAM memory cell to another location. In the example of FIG. 8A, the logical value read from the NVRAM memory cell is provided to a corresponding DRAM memory cell. Thus, at time point D, the row decoder 20 asserts the WLD signal line by driving this signal line to a high voltage. The asserted WLD signal, line provides a high voltage to the gate of the T1 transistor of the DRAM memory cell. This gate voltage turns on the T1 transistor of the DRAM memory cell thus coupling the C1 capacitor to the bit line BLT.

At time point F, the row decoder de-asserts the WLD and WLNV signals by driving these signals to a low voltage. The de-asserted WLNV signal line provides a low voltage to the gate of the T1 transistor of the NVRAM memory cell. This gate voltage turns off the T1 transistor thus decoupling the C1 capacitor of the NVRAM cell from the bit line BLT. Here, the charge restored to the C1 capacitor through the operation of the sense amplifier 25 remains stored in the NVRAM memory cell. The de-asserted WLD signal line provides a low voltage to the gate of the T1 transistor of the DRAM memory cell. This gate voltage turns off the T1 transistor thus decoupling the C1 capacitor of the DRAM cell from the bit line BLT. Here, the charge stored to the C1 capacitor through the operation of the sense amplifier 25 remains stored in the DRAM memory cell. With the bit lines BLT and BLC de-coupled from the DRAM and NVRAM cells, these signal lines return to a low voltage.

Figure 11B:
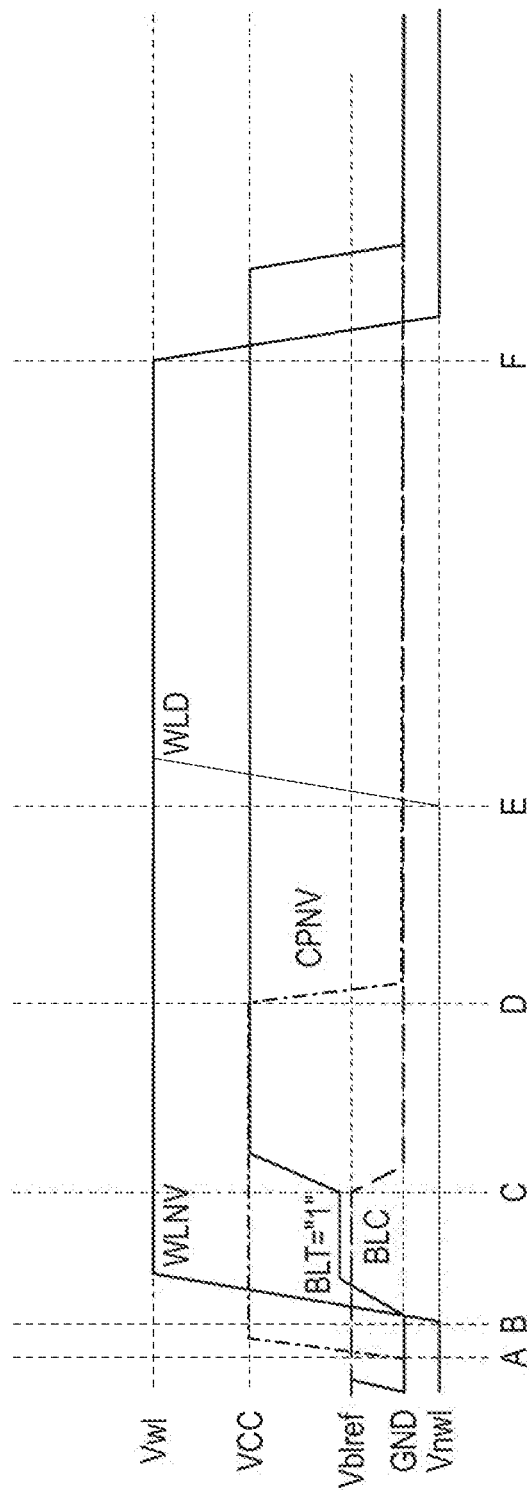

FIG. 11B is a timing diagram that illustrates a memory operation that copies data from an NVRAM memory cell to a DRAM memory cell in accordance with an embodiment of the present disclosure. The memory operation of FIG. 11B may occur in any of the various hybrid NVRAM/DRAM structures discussed herein, but is illustrated in FIG. 11B with specific reference to a 1T1C configuration. By way of example and not limitation, FIG. 11B illustrates a memory operation that reads and writes a logical "1" value. The memory operation of FIG. 11B is similar to the memory operation of FIG. 11A; however, in FIG. 11B the memory operation reads and writes a logical "1" value. Thus, initially, the row decoder does not apply a signal on either the WLD or the WLD lines and the state of the circuit is as described above in connection with FIG. 11A. At time point A, the CPNV signal line is driven to a high voltage in preparation for the logic value stored in the C1 capacitor to be read out of the NVRAM memory cell. At time point B, the row decoder 20 provides a high voltage to the WLNV so as, to transfer the charge stored in the C1 capacitor onto the bit line BLT. Here, the BLC voltage rises above ground to a reference voltage and the BLT voltage rises above ground by a larger amount as compared to the voltage rise on the BLC line. At time point C, the sense amplifier 25 is triggered and the voltage on the bit line BLC is driven to a high voltage and the voltage on the bit line BLT is driven to a low voltage. At time point D, the CPNV signal line is driven to a low voltage and the logical "1" represented by the high voltage on the BLT line is restored to the C1 capacitor of the NVRAM memory cell. At time point E, the row decoder 20 drives the WLD to a high voltage so as to store the logical value read from the NVRAM cell in the DRAM cell.

Figure 12:
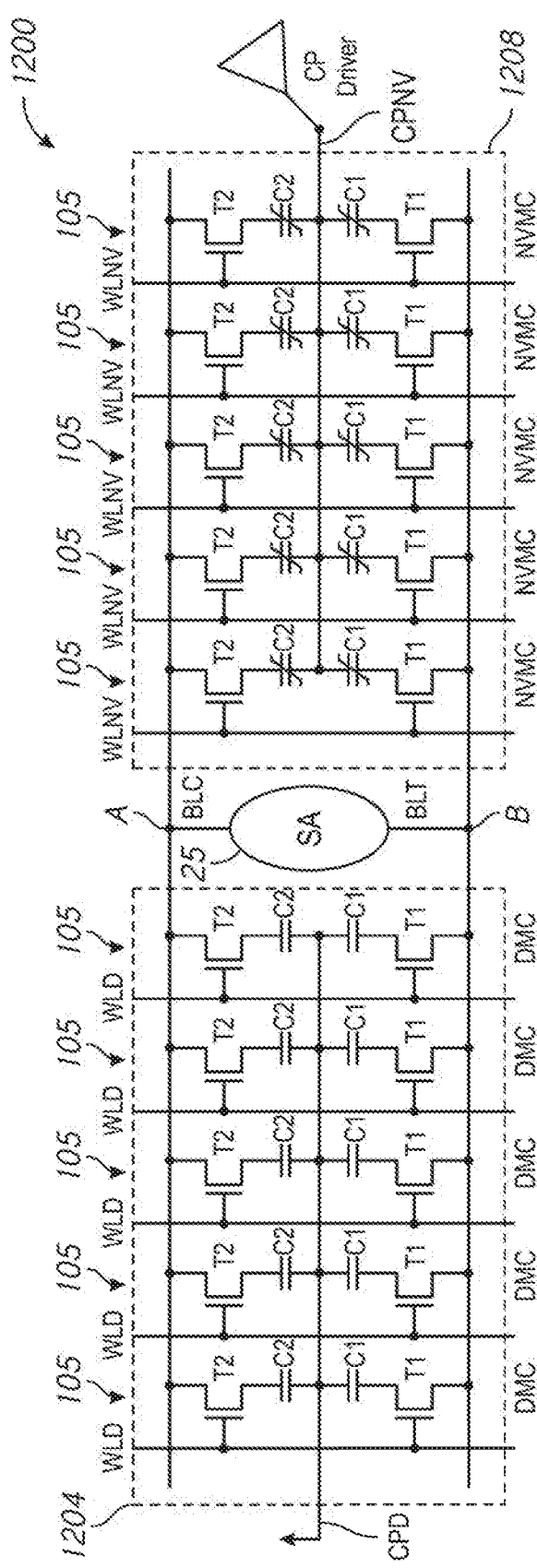
FIG. 12 illustrates an example circuit that includes a planar arrangement of memory cells in accordance with the present disclosure.

Although the memory cells 105 are shown vertically stacked in FIGS. 4B, 5B, 6B, and 9B, in some embodiments of the present disclosure, a single layer of memory cells 105 is included in a memory array. For example, i some embodiments a memory array includes a single layer of memory cells 105, without memory cells 105 stacked thereon. FIG. 12 illustrates an example circuit 1200 that includes such a planar arrangement. The example circuit 1200 includes a column of memory cells 105 according to an embodiment of the present disclosure. The example circuit 1200 includes DRAM memory cells 1204 and NVRAM memory cells 1208. The circuit 1200 further includes word lines WLNV and WLD, digit lines BLT and BLC, and sense component 25. The digit line BLT is coupled to a sense node A of the sense component 25 and the digit line BLC is coupled to a sense node B of the sense component 25. The word lines, digit lines, and sense component may be examples of memory cells 105, word lines 12, digit, lines 15, and sense component 25, respectively, as described with reference to FIG. 1. While one column and eight rows of memory cells 105 are shown in FIG. 12, a memory array may include many columns and rows of memory cells as those shown.

Memory cells 105 may include a logic storage component, such as capacitors and selection components. In the NVRAM memory cells 105 NVMC, the capacitors of the memory cells 105 may be ferroelectric capacitors. In the DRAM memory cells 105, the capacitors of the memory cells 105 may be dielectric capacitors. The capacitors may discharge upon coupling to digit lines BLT and BLC. As previously described, various states may be stored by charging or discharging the capacitors of the memory cell 105. The selection components of memory cell 105 may be activated by a respective word line. The NVRAM memory cells NVMC may be activated by a respective word line WLNV. The DRAM memory cells DMC may be activated by a respective word line WLD. The NVRAM memory cells NVMC may be coupled to a plate line CPNV that may be used during access of the memory cells. The DRAM memory cells DMC may be coupled to a plate line CPD that may be used during access of the memory cells 105.

Various embodiments of memory cells have two transistors and two capacitors have been disclosed with reference to FIGS. 1-12. The transistors in some embodiments of the memory cells may be vertical transistors each formed from a respective semiconductor pillar. The conductive materials of the first and second plates of the capacitors C1 and C2 may be any suitable conductive materials, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. Some or all of plates of the capacitors C1 and C2 may comprise the same composition as one another, or may comprise different compositions relative to one another.

In the NVRAM memory cells discussed herein, the capacitors C1 and C2 are ferroelectric capacitors. The ferroelectric materials of the capacitors C1 and C2 may comprise any suitable composition or combination of compositions. In some embodiments the capacitor dielectric materials may comprise ferroelectric material. For instance, the capacitor dielectric materials may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element. In some embodiments the ferroelectric materials may comprise a same composition as one another, and in other embodiments may comprise different compositions relative to one another.

The plate line structure CP may comprise any suitable conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc.

The semiconductor pillars may comprise any suitable semiconductor materials including, for example, one or both of silicon and germanium. The source/drain regions, and channel region, may be doped with any suitable dopants. In some embodiments the source/drain regions may be n-type majority doped, and in other embodiments may be p-type majority doped.

The word lines (WLNV and WLD) and digit lines (BLT and BLC) may comprise any suitable electrically conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. The word lines and digit lines may comprise the same composition as one another, or may comprise different compositions relative to one another.

Insulative material may surround the various components of memory cells disclosed herein. Such insulative material may comprise any suitable composition or combination of compositions; including, for example, one or more of silicon dioxide, silicon nitride, borophosphosilicate glass, spin-on dielectric, etc. Although insulative material may be a single homogeneous material in some embodiments, in other embodiments the insulative material may include two or more discrete insulative compositions.

Figure 13:
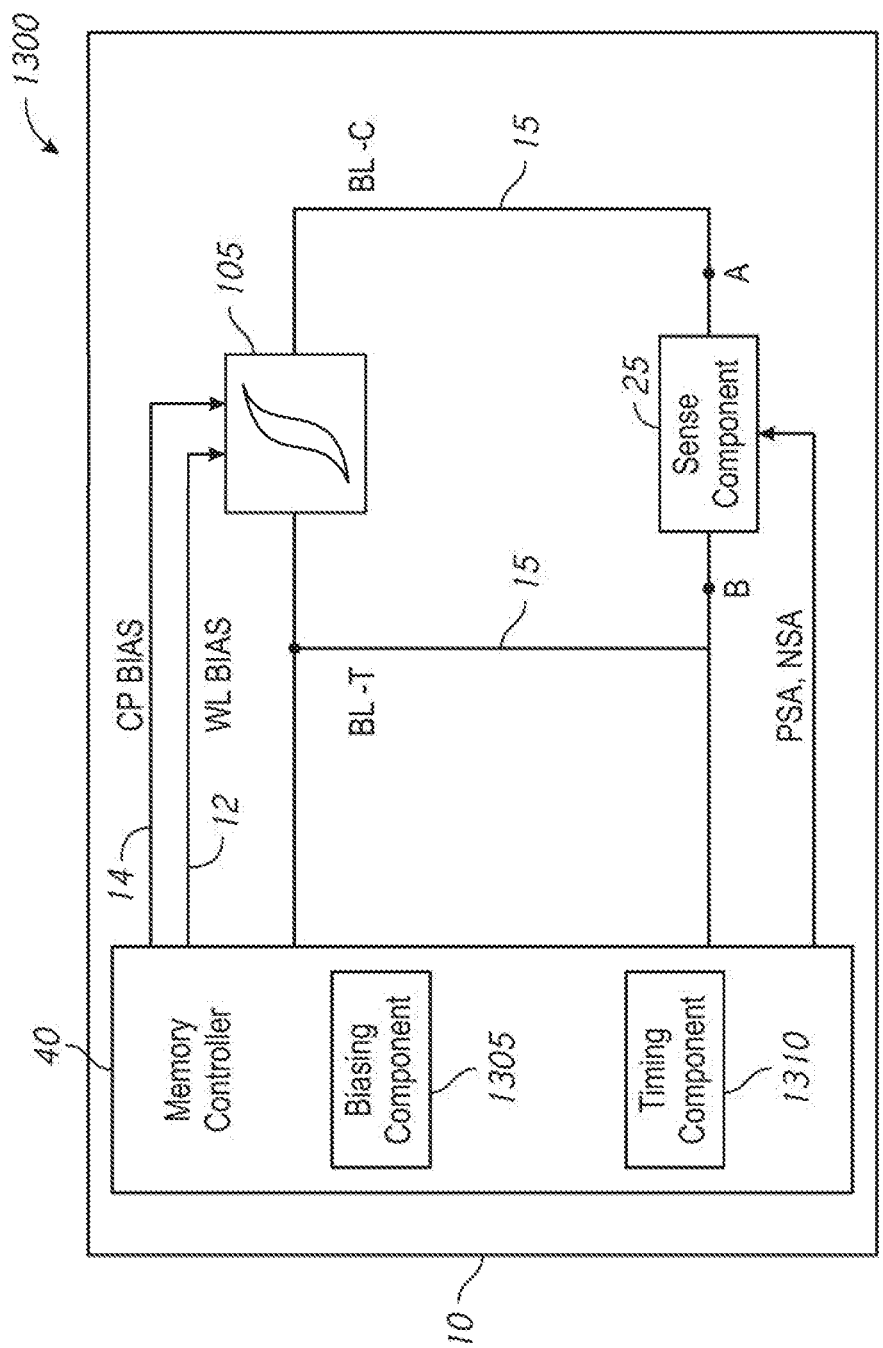
FIG. 13 is a block diagram of a memory that supports a ferroelectric memory in accordance with various embodiments of the present disclosure.

FIG. 13 illustrates a block diagram of a portion of memory 1300 that includes memory array 10 that supports a dielectric and/or ferroelectric memory in accordance with various embodiments of the present disclosure. Memory array 10 may be referred to as an electronic memory apparatus and includes memory controller 40 and memory cell 105, which may be examples of memory controller 40 and memory cell 105 described with reference various embodiments discussed herein.

Memory controller 40 may include biasing component 1305 and timing component 810, and may operate memory array 10 as described in FIG. 1. Memory controller 40 may be in electronic communication with word lines 12, capacitor plate bias lines 14, digit lines 15, and sense component 25, which may be examples of word line 12, plate lines (CPD or CPNV), digit line 15, and sense component 25 described with reference to FIGS. 1-12. The components of memory array 10 may be in electronic communication with each other and may perform the functions described with reference to FIGS. 1-13.

Memory controller 40 may be configured to activate word lines 12 or digit lines 15 by applying voltages to the word and digit lines. For example, biasing component 1405 may be configured to apply a voltage to operate memory cell 105 to read or write memory cell 105 as described above. In some cases, memory controller 40 may include a row decoder, column decoder, or both, as described with reference to FIG. 1. This may enable memory controller 40 to access one or more memory cells 105. Biasing component 1305 may also provide voltage potentials for the operation of sense component 25.

Memory controller 40 may further determine a logic state of the ferroelectric and/or dielectric memory cell 105 based on activating sense component 25, and write the logic state of the ferroelectric memory cell 105 back to the ferroelectric memory cell 105. In some cases, memory controller 40 may perform its operations using timing component 1310. For example, timing component 1310 may control the timing of the various word line selections or plate line biasing, including timing for switching and voltage application to perform the memory functions, such as reading and writing, discussed herein. In some cases, timing component 1310 may control the operations of biasing component 1305. For example, the memory controller 40 may control the biasing component 1305 to provide a read voltage VREAD to the plate line CP to change the voltage of the memory cell, the digit lines BLT and BLC, and sense node A and sense node B of sense component 25. Following the biasing of the plate line CP, the memory controller 40 may control the sensing component 25 to compare the voltage of sense node A to the voltage of sense node B.

Upon determining and amplifying the voltage difference, the sense component 25 may latch the state, where a may be used in accordance with the operations of an electronic device that memory array 10 is a part.

Figure 14:
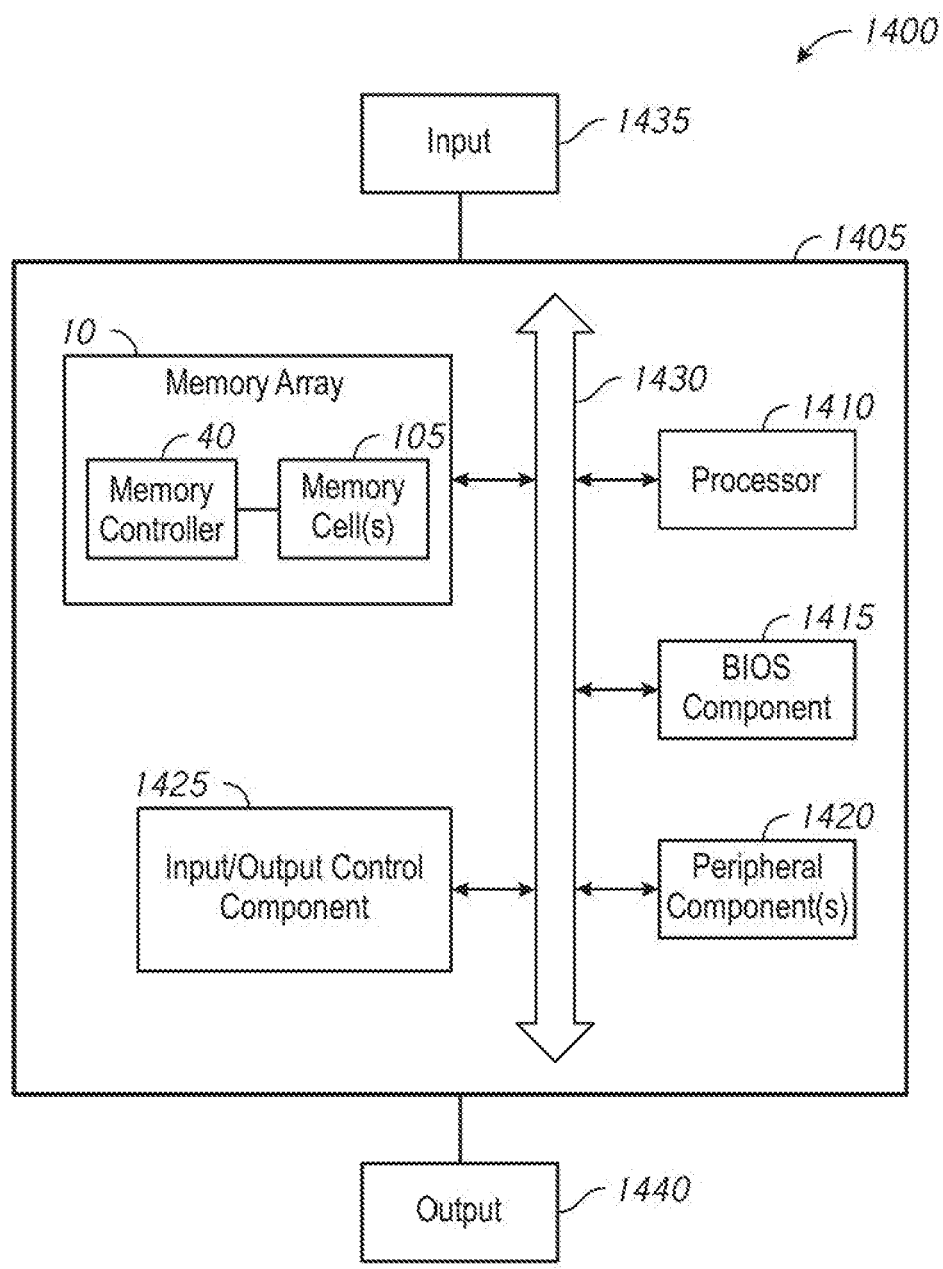
FIG. 14 is a block diagram of a system that supports a ferroelectric memory in accordance with various embodiments of the present disclosure.

FIG. 14 illustrates a system 1400 that supports a ferroelectric memory in accordance with various embodiments of the present disclosure. System 1400 includes a device 1405, which may be or include a printed circuit board to connect or physically support various components. Device 1405 may be a computer, notebook computer, laptop, tablet computer, mobile phone, or the like. Device 1405 includes a memory array 10, which may be an example of memory array 10 as described with reference to FIGS. 1-13. Memory array 10 may contain memory controller 40 and memory cell(s) 105, which may be examples of memory controller 40 and memory cells 105 described with reference to FIGS. 1-13. Device 1405 may also include a processor 1410, BIOS component 1415, peripheral component(s) 1420, and input/output control component 1425. The components of device 1405 may be in electronic communication with one another through bus 1430.

Processor 1410 may be configured to operate ray 10 through memory controller 40. In some cases, processor 1410 may perform the of memory controller 40 described with reference to FIGS. 1 and 13. In other cases, memory controller 40 may be integrated into processor 1410. Processor 1410 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. The processor 1410 may perform various functions and operate the memory array 10 as described herein. Processor 1410 may, for example, be configured to execute computer-readable instructions stored in memory array 10 to cause device 1405 perform various functions or tasks.

BIOS component 1415 may be a software component that includes a basic input/output system (BIOS) operated as firmware, which may initialize and run various hardware components of system 1400. BIOS component 1415 may also manage data flow between processor 1410 and the various components, e.g., peripheral components 1420, input/output control component 1425, etc. BIOS component 1415 may include a program or software stored in read-only memory (ROM), flash memory, or any other non-volatile memory.

Peripheral component(s) 1420 may be any input or output device, or an interface for such devices, that is integrated into device 1405. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1425 may manage data communication between processor 1410 and peripheral component(s) 1420, input devices 1435, or output devices 1440. Input/output control component 1425 may also manage peripherals not integrated into device 1405. In some cases, input/output control component 1425 may represent a physical connection or port to the external peripheral.

Input 1435 may represent a device or signal external to device 1405 that provides input to device 1405 or its components. This may include a user interface or interface with or between other devices. In some cases, input 1435 may be a peripheral that interfaces with device 1405 via peripheral component(s) 1420 or may be managed by input/output control component 1425.

Output 1440 may represent a device or signal external to device 1405 configured to receive output from device 1405 or any of its components. Examples of output 1440 may include a display, audio speakers, a printing device, another processor or printed circuit board, etc. In some cases, output 1440 may be a peripheral that interfaces with device 1405 via peripheral component(s) 1420 or may be managed by input/output control component 1425.

The components of memory controller 40, device 1405, and memory array 10 may be made up of circuitry designed to carry out their functions. This may include various circuit elements, for example, conductive lines, transistors, capacitors, inductors, resistors, amplifiers, or other active or inactive elements, configured to carry out the functions described herein.

The above specification, drawings, examples and data provide a complete description of the structure and use of exemplary embodiments of the invention as defined in the claims. Although various embodiments of the claimed invention have been described above with a certain degree of particularity, or with reference to one or more individual embodiments, those skilled in the art could make numerous alterations to the disclosed embodiments without departing from the spirit or scope of the claimed invention. Other embodiments are therefore contemplated. It is intended that all matter contained in the above description and shown in the accompanying drawings shall be interpreted as illustrative only of particular embodiments and not limiting.

Changes in detail or structure may be made without departing from the basic elements of the invention as defined in the following claims.

The invention claimed is:
1. An apparatus, comprising:
a first memory cell comprising first and second ferroelectric capacitors configured to store first charges representing complementary logical values, both the first and second ferroelectric capacitors coupled to a first plate line;
a second memory cell comprising first and second dielectric capacitors configured to store second charges representing complementary logical values;
a first bit line selectably coupled to the first ferroelectric capacitor of the first memory cell and to the first dielectric capacitor of the second memory cell;
a second bit line selectably coupled to the second ferroelectric capacitor of the first memory cell and to the second dielectric capacitor of the second memory cell;
a first word line selectably coupled to the first memory cell; and
a second word line selectably coupled to the second memory cell,
wherein, when the first and second word lines are driven to a same voltage, the first memory cell is further configured store the first charges to the first and second ferroelectric capacitors of the first memory cell and the second memory cell is configured to restore the second charges to the first and second dielectric capacitors.
2. The apparatus of claim 1, further comprising:
a sense amplifier coupled to the first and second bit lines.
3. The apparatus of claim 2, the sense amplifier is configured to transfer data between the first memory cell and the second memory cell.
4. The apparatus of claim 1, wherein the first memory cell is vertically displaced relative to the second memory cell.
5. The apparatus of claim 1, wherein:
the first ferroelectric capacitor of the first memory cell includes a first plate, a second plate, and a ferroelectric material disposed between the first and second plates, the first plate coupled to a first plate line structure of the first plate line; and
the second ferroelectric capacitor of the first memory cells includes a first plate, a second plate, and a ferroelectric material disposed between the first and second plates, the first plate coupled to the first plate line structure.
6. The apparatus of claim 5, wherein:
the first dielectric capacitor of the second memory cell includes a first plate, a second plate, and a dielectric material disposed between the first and second plates, the first plate coupled to a second plate line structure; and
the second dielectric capacitor of the second memory cells includes a first plate, a second plate, and a dielectric material disposed between the first and second plates, the first plate coupled to the second plate line structure.
7. The apparatus of claim 6, wherein:
the first memory cell includes a first transistor configured to selectably couple the first ferroelectric capacitor of the first memory cell to the first bit line and a second transistor configured to selectably couple the second ferroelectric capacitor of the first memory cell to the second bit line, the first transistor vertically displaced relative to the first ferroelectric capacitor and coupled to the second plate of the first ferroelectric capacitor, the second transistor vertically displaced relative to the second ferroelectric capacitor and coupled to the second plate of the second capacitor.
8. The apparatus of claim 7, wherein:
the second memory cell includes a first transistor configured to selectably couple the first dielectric capacitor of the second memory cell to the first bit line and a second transistor configured to selectably couple the second dielectric capacitor of the second memory cell to the second bit line, the first transistor vertically displaced relative to the first dielectric capacitor and coupled to the second plate of the first dielectric capacitor, the second transistor vertically displaced relative to the second dielectric capacitor and coupled to the second plate of the second dielectric capacitor.
9. The apparatus of claim 1, further comprising:
a third memory cell comprising first and second dielectric capacitors configured to store charges representing complementary logical values;
a fourth memory cell comprising first and second ferroelectric capacitors configured to store charges representing complementary logical values;
a third bit line selectably coupled to the first dielectric capacitor of the third memory cell and to first ferroelectric capacitor of the fourth memory cell;
a fourth bit line selectably coupled to the second dielectric capacitor of the third memory cell and to the second ferroelectric capacitor of the fourth memory cell; and
a second sense amplifier coupled to the third and fourth bit lines.
10. The apparatus of claim 9, wherein:
the first memory cell is vertically displaced relative to the second memory cell;
the second memory cell is vertically displaced relative to the third memory cell; and
the third memory cell is vertically displaced relative to the forth memory cell.
11. The apparatus of claim 9, wherein:
the first ferroelectric capacitor of the first memory cell includes a first plate; a second plate, and a ferroelectric material disposed between the first and second plates, the first plate coupled to a first plate line structure of the first plate line;
the second ferroelectric capacitor of the first memory cells includes a first plate, a second plate, and a ferroelectric material disposed between the first and second plates, the first plate coupled to the first plate line structure;
the first dielectric capacitor of the second memory cell includes a first plate, a second plate, and a dielectric material disposed between the first and second plates, the first plate coupled to a second plate line structure; and
the second dielectric capacitor of the second memory cells includes a first plate, a second plate, and a dielectric material disposed between the first and second plates, the first plate coupled to the second plate line structure.
12. The apparatus of claim 11, wherein:
the first dielectric capacitor of the third memory cell includes a first plate; a second plate, and a dielectric material disposed between the first and second plates, the first plate coupled to the second plate line structure;
the second dielectric capacitor of the third memory cells includes a first plate, a second plate, and a dielectric material disposed between the first and second plates, the first plate coupled to the second plate line structure;
the first ferroelectric capacitor of the fourth memory cell includes a first plate, a second plate, and a ferroelectric material disposed between the first and second plates, the first plate coupled to third first plate line structure; and the second ferroelectric capacitor of the fourth memory cells includes a first plate, a second plate, and a ferroelectric material disposed between the first and second plates, the first plate coupled to the third plate line structure.

13. The apparatus of claim 12, wherein:

the first memory cell includes a first transistor configured to selectably couple the first ferroelectric capacitor of the first memory cell to the first bit line and a second transistor configured to selectably couple the second ferroelectric capacitor of the first memory cell to the second bit line, the first transistor vertically displaced relative to the first ferroelectric capacitor and coupled to the second plate of the first ferroelectric capacitor, the second transistor vertically displaced relative to the second ferroelectric capacitor and coupled to the second plate of the second capacitor;

the second memory cell includes a first transistor configured to selectably couple the first dielectric capacitor of the second memory cell to the first bit line and a second transistor configured to selectably couple the second dielectric capacitor of the second memory cell to the second bit line, the first transistor vertically displaced relative to the first dielectric capacitor and coupled to the second plate of the first dielectric capacitor, the second transistor vertically displaced relative to the second dielectric capacitor and coupled to the second plate of the second dielectric capacitor;

the third memory cell includes a first transistor configured to selectably couple the first dielectric capacitor of the third memory cell to the third bit line and a second transistor configured to selectably couple the second dielectric capacitor of the third memory cell to the fourth bit line, the first transistor vertically displaced relative to the first dielectric capacitor and coupled to the second plate of the first dielectric capacitor, the second transistor vertically displaced relative to the second dielectric capacitor and coupled to the second plate of the second dielectric capacitor; and the fourth memory cell includes a first transistor configured to selectably couple the first ferroelectric capacitor of the fourth memory cell to the third bit line and a second transistor configured to selectably couple the second ferroelectric capacitor of the fourth memory cell to the fourth bit line, the first transistor vertically displaced relative to the first ferroelectric capacitor and coupled to the second plate of the first ferroelectric capacitor, the second transistor vertically displaced relative to the second ferroelectric capacitor and coupled to the second plate of the second capacitor.

14. The apparatus of claim 1, wherein the first memory cell and the second memory cell are arranged in planar configuration.

15. An apparatus, comprising:

a first memory cell comprising first and second ferroelectric capacitors configured to store charges representing complementary logical values, the first ferroelectric capacitor includes a first plate, a second plate, and a ferroelectric material disposed between the first and second plates, the second ferroelectric capacitor includes a first plate, a second plate, and a ferroelectric material disposed between the first and second plates, the first plate of the first and second ferroelectric capacitors coupled to a first plate line structure, the first plate line structure coupled to a voltage driver that is configured to toggle the voltage on the first plate line structure when data is written to the first memory cell;

a second memory cell comprising first and second dielectric capacitors configured to store charges representing complementary logical values, the first dielectric capacitor includes a first plate, a second plate, and a dielectric material disposed between the first and second plates, the second dielectric capacitor includes a first plate, a second plate, and a dielectric material disposed between the first and second plates, the first plate of the first and second dielectric capacitors coupled to a second plate line structure, the second plate line structure is coupled to a constant voltage;

a first bit line selectably coupled to the first ferroelectric capacitor of the first memory cell and to the first dielectric capacitor of the second memory cell; and a second bit line selectably coupled to the second ferroelectric capacitor of the first memory cell and to the second dielectric capacitor of the second memory cell.

16. An apparatus, comprising:

a first memory cell comprising first and second ferroelectric capacitors configured to store charges representing complementary logical values, the first ferroelectric capacitor includes a first plate, a second plate, and a ferroelectric material disposed between the first and second plates, the second ferroelectric capacitor includes a first plate, a second plate, and a ferroelectric material disposed between the first and second plates, the first plate of the first and second ferroelectric capacitors coupled to a first plate line structure;

a second memory cell comprising first and second dielectric capacitors configured to store charges representing complementary logical values, the first dielectric capacitor includes a first plate, a second plate, and a dielectric material disposed between the first and second plates, the second dielectric capacitor includes a first plate, a second plate, and a dielectric material disposed between the first and second plates, the first plate of the first and second dielectric capacitors coupled to a second plate line structure;

a third memory cell comprising first and second dielectric capacitors configured to store charges representing complementary logical values, the first dielectric capacitor includes a first plate, a second plate, and a dielectric material disposed between the first and second plates, the second dielectric capacitor includes a first plate, a second plate, and a dielectric material disposed between the first and second plates, the first plate of the first and second dielectric capacitors of the third memory cell coupled to the second plate line structure;

a fourth memory cell comprising first and second ferroelectric capacitors configured to store charges representing complementary logical values, the first ferroelectric capacitor includes a first plate, a second plate, and a ferroelectric material disposed between the first and second plates, the second ferroelectric capacitor includes a first plate, a second plate, and a ferroelectric material disposed between the first and second plates, the first plate of the first and second ferroelectric capacitors of the fourth memory cell coupled to a third plate line structure;

a first bit line selectably coupled to the first ferroelectric capacitor of the first memory cell and to the first dielectric capacitor of the second memory cell;

a second bit line selectably coupled to the second ferroelectric capacitor of the first memory cell and to the second dielectric capacitor of the second memory cell;

a third bit line selectably coupled to the first dielectric capacitor of the third memory cell and to first ferroelectric capacitor of the fourth memory cell;

a fourth bit line selectably coupled to the second dielectric capacitor of the third memory cell and to the second ferroelectric capacitor of the fourth memory cell; and a second sense amplifier coupled to the third and fourth bit lines, wherein:

the first plate line structure is coupled to a voltage driver that is configured to toggle the voltage on the first plate line structure when data is written to the first memory cell;

the second plate line structure is coupled to a constant voltage; and the third plate line structure is coupled to a voltage driver that is configured to toggle the voltage on the third plate line structure when data is written to the third memory cell.

17. An apparatus, comprising:
a first memory cell comprising a ferroelectric capacitor configured to store a first charge representing a logical value;
a second memory cell comprising a dielectric capacitor configured to store a second charge representing a logical value;
a first bit line selectably coupled to the ferroelectric capacitor of the first memory cell and to the dielectric capacitor of the second memory cell;
a first word line selectably coupled to the first memory cell; and
a second word line selectably coupled to the second memory cell,
wherein, when the first and second word lines are driven to a same voltage, the first memory cell is further configured store the first charge to the ferroelectric capacitor of the first memory cell and the second memory cell is configured to restore the second charge to the dielectric capacitor.

18. The apparatus of claim 17, further comprising:
a sense amplifier coupled to the first and second bit lines, wherein the sense amplifier is configured to transfer data between the first memory cell and the second memory cell.

19. The apparatus of claim 17, wherein the ferroelectric capacitor of the first memory cell is a first ferroelectric capacitor and the first memory cell further comprises a second ferroelectric capacitor configured to store a charge that is complementary to the logical value stored by the first ferroelectric capacitor.

20. The apparatus of claim 17, wherein the dielectric capacitor of the second memory cell is a first dielectric capacitor and the second memory cell further comprises a second dielectric capacitor configured to store a charge that is complementary to the logical value stored by the first dielectric capacitor.

21. The apparatus of claim 17, wherein the first memory cell is vertically displaced relative to the second memory cell.

22. The apparatus of claim 17, wherein:
the ferroelectric capacitor of the first memory cell includes a first plate, a second plate, and a ferroelectric material disposed between the first and second plates, the first plate coupled to a first plate line structure.

23. A method, comprising:
reading a data bit from a first memory cell that includes first and second dielectric capacitors configured to store charges that represent the data bit through complementary logical values;
latching the data bit at a sense amplifier; and
writing the data bit from the sense amplifier to a second memory cell that includes first and second ferroelectric capacitors configured to store charges that represent the data bit through complementary logical values.

24. The method of claim 23, further comprising:
writing the data bit from the sense amplifier back to the first memory cell.

25. The method of claim 23, wherein the second memory cell includes a capacitor plate line structure and writing the data bit to the second memory cell includes toggling a voltage of the capacitor plate line structure between a first voltage and a second voltage.

26. The method of claim 25, wherein a first data value is written to the first ferroelectric capacitor when the first voltage is applied to the capacitor plate line structure, and a second data value is written to the second ferroelectric capacitor when the second voltage is applied to the capacitor plate line structure.

27. A method, comprising:
reading a data bit from a first memory cell that includes first and second ferroelectric capacitors configured to store charges that represent the data bit through complementary logical values;
latching the data bit at a sense amplifier; and
writing the data bit from the sense amplifier to a second memory cell that includes first and second dielectric capacitors configured to store charges that represent the data bit through complementary logical values.

28. The method of claim 27, further comprising:
writing the data bit from the sense amplifier back to the first memory cell.

29. The method of claim 28, wherein the first memory cell includes a capacitor plate line structure and writing the data bit back to the first memory cell include toggling a voltage of the capacitor plate line structure between a first voltage and a second voltage.

30. The method of claim 29, wherein a first data value is written back to the first ferroelectric capacitor when the first voltage is applied to the capacitor plate line structure, and a second data value is written back to the second ferroelectric capacitor when the second voltage is applied to the capacitor plate line structure.

* * * * *